United States Patent [19]
Fleming

[11] Patent Number: 6,020,272
[45] Date of Patent: Feb. 1, 2000

[54] METHOD FOR FORMING SUSPENDED MICROMECHANICAL STRUCTURES

[75] Inventor: James G. Fleming, Albuquerque, N.Mex.

[73] Assignee: Sandia Corporation, Albuquerque, N.Mex.

[21] Appl. No.: 09/169,307

[22] Filed: Oct. 8, 1998

[51] Int. Cl.⁷ .................................................. H01L 21/00
[52] U.S. Cl. ............................ 438/734; 216/2; 438/733; 438/739; 438/749; 438/753
[58] Field of Search ..................... 438/719, 733, 438/734, 735, 739, 750, 753, 749; 216/2, 79, 99

[56] References Cited

U.S. PATENT DOCUMENTS

| | | | |
|---|---|---|---|
| 4,470,875 | 9/1984 | Poteat | 156/644 |
| 4,783,237 | 11/1988 | Aine et al. | 216/2 X |
| 4,812,199 | 3/1989 | Sickafus | 216/2 |
| 4,922,756 | 5/1990 | Henrion | 73/517 R |
| 5,087,124 | 2/1992 | Smith | 356/358 |
| 5,426,070 | 6/1995 | Shaw et al. | 216/2 |
| 5,441,600 | 8/1995 | Smits | 216/51 |
| 5,554,304 | 9/1996 | Suzuki | 216/2 |
| 5,633,552 | 5/1997 | Lee | 310/311 |
| 5,709,773 | 1/1998 | Field | 156/647.1 |
| 5,719,073 | 2/1998 | Shaw | 437/228 |
| 5,770,465 | 6/1998 | MacDonald | 437/67 |
| 5,804,314 | 9/1998 | Field | 428/402 |

OTHER PUBLICATIONS

G. Ensell, "Free Standing Single–Crystal Silicon Microstructures," *Journal of Micromechanical Microengineering*, vol. 5, pp. 1–4 (1995).

B.C.S. Chou, C.–N. Chen, J.–S. Shie, W.–H. Huang and C.–J. Chen, "Anisotropic Etching of (111)–Oriented Silicon and Applications," *SPIE Conference on Micromachining and Microfabrication Process Technology IV*, SPIE vol. 3511, pp. 337–341, Sep. 1998.

*Primary Examiner*—William Powell
*Attorney, Agent, or Firm*—John P. Hohimer

[57] ABSTRACT

A micromachining method is disclosed for forming a suspended micromechanical structure from {111} crystalline silicon. The micromachining method is based on the use of anisotropic dry etching to define lateral features of the structure which are etched down into a {111}-silicon substrate to a first etch depth, thereby forming sidewalls of the structure. The sidewalls are then coated with a protection layer, and the substrate is dry etched to a second etch depth to define a spacing of the structure from the substrate. A selective anisotropic wet etchant (e.g. KOH, EDP, TMAH, NaOH or CsOH) is used to laterally undercut the structure between the first and second etch depths, thereby forming a substantially planar lower surface of the structure along a {111} crystal plane that is parallel to an upper surface of the structure. The lateral extent of undercutting by the wet etchant is controlled and effectively terminated by either timing the etching, by the location of angled {111}-silicon planes or by the locations of preformed etch-stops. This present method allows the formation of suspended micromechanical structures having large vertical dimensions and large masses while allowing for detailed lateral features which can be provided by dry etch definition. Additionally, the method of the present invention is compatible with the formation of electronic circuitry on the substrate.

69 Claims, 22 Drawing Sheets

METHOD FOR FORMING SUSPENDED MICROMECHANICAL STRUCTURES

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates generally to microelectromechanical devices, and specifically to a bulk micromachining method for forming suspended micromechanical structures on silicon substrates having a {111} crystal orientation.

BACKGROUND OF THE INVENTION

Most micromachined devices can be split into two major classes: those formed by surface micromachining methods, and those formed by bulk micromachining methods. Surface micromachining methods are based on patterning films deposited on a substrate; whereas bulk micromachining methods are based on sculpting a bulk substrate using etchants.

Surface micromachining processes generally use deposited low-stress polycrystalline silicon (also termed polysilicon) layers to form elements of a micromechanical structure, with sacrificial layers (e.g. comprising silicon dioxide or silicate glass) separating the polysilicon layers from each other and from the substrate. Since the layers are patterned by photolithography, they can be very accurately defined and have essentially arbitrary lateral shapes. After defining the micromechanical structure in the polysilicon layers, the sacrificial layers are removed with a selective etchant comprising hydrofluoric acid (HF) to release the micromechanical structure for operation.

Although surface micromachining has proven useful for fabricating many types of micromechanical devices including accelerometers, motors, gear trains and moveable mirrors, such surface-micromachined devices are limited in the vertical dimension (i.e. the out-of-plane dimension which is generally referred to as the Z dimension) to an overall thickness of about 6 $\mu$m for the polysilicon layers and about 3 $\mu$m for the sacrificial layers. This limitation in overall thickness of surface-micromachined devices is primarily due to problems of stress in the layers, with the low deposition rate for polysilicon also being a limiting factor. Accordingly, surface-micromachined devices are essentially two dimensional in structure with a low stiffness in the Z dimension; and this limits, for example, the force possible from actuators (e.g. electrostatic comb actuators) and linkages, and the mass and sensitivity of inertial sensors (i.e. accelerometers).

The low stiffness in the Z dimension can also cause problems due to stiction whereby, after release, elements of the surface-micromachined device can reattach or stick to the underlying substrate due to a variety of causes including static electricity. Fabrication of surface-micromachined devices, therefore, can require additional, and often elaborate, process steps to prevent or overcome stiction.

Another problem with surface-micromachined devices is that these devices generally require a long-duration high-temperature annealing step to relieve stress in the polysilicon layers. This high-temperature annealing step greatly complicates the problem of integrating surface-micromachined devices with electronic circuitry (e.g. CMOS or bipolar circuitry) since the annealing temperature (typically 700–1300°C.) exceeds the melting point of aluminum that is commonly used as the interconnect metallization for integrated circuits.

An additional problem with the use of surface micromachining is the need for an aggressive HF-based etchant for release of the surface-micromachined devices. The etch release step can take many hours during which time other elements of the device such as electronic circuitry must be overcoated to protect these elements from attack by the HF-based etchant.

Finally, surface-micromachined devices fabricated with polysilicon can have properties inferior to the properties of devices fabricated with a crystalline structure. For example, the granularity of polysilicon results in a lower mechanical strength and inferior electronic properties than those of single crystal silicon. Additionally, the light reflecting properties of deposited polysilicon are inferior to those of crystalline silicon.

In bulk micromachining, a silicon substrate is etched and sculpted with a wet etchant to form relatively massive micromechanical structures such as accelerometers, or fluid valving and delivery systems. The attraction of bulk micromachining is that it can produce parts which have a high stiffness in the Z dimension, and relatively large masses for inertial sensors. The present disadvantage of bulk micromachining is that there are only a limited number of possible shapes that can be fabricated since bulk micromachining processes are typically highly dependent on the crystal orientation of the substrate. Additionally, bulk micromachining generally produces shapes that have sidewalls that are not orthogonal to a top surface of the substrate. The shape of elements of a bulk-micromachined device can also be controlled to a limited extent by the use of a high dose of implanted boron which acts as an etch stop. However, in general, the type, shape and size of micromechanical structures that can be fabricated by bulk micromachining is severely limited. In particular, the formation of fine features of arbitrary shape on a micron-size scale has not been possible with bulk micromachining as practiced heretofore.

What is needed is a micromachining method that combines the best features of both surface micromachining and bulk micromachining. Such a method should allow the formation of lateral features of arbitrary size with micron-scale resolution, while at the same time allowing the rapid and accurate removal of underlying material to a predetermined stopping point. According to the present invention, such a method is possible by the substitution of a {111}-oriented silicon substrate for the commonly used {100}-oriented silicon substrates and by the use of anisotropic dry etching in combination with anisotropic wet etching.

An advantage of the method of the present invention, based on the use of a {111}-oriented silicon substrate, is that {111} planes of silicon which are parallel to and form the major surfaces of the substrate can be used to control an anisotropic wet etching step that is used to rapidly and accurately form one or more planar surfaces of a micromechanical device (e.g. to form a plate or beam of the device).

A further advantage of the method of the present invention is that the wet etching step can be used to partially or completely undercut one or more elements of the micromechanical device, forming a lower surface of the device which is co-planar with an upper surface of the device and stopping at a predetermined location as determined by an angled {111}-silicon plane or by a fabricated etch-stop.

Another advantage is that the method of the present invention can be used to form a micromechanical structure having a layer thickness in the range of a few microns to hundreds of microns to provide a high stiffness in the vertical (Z) dimension.

Yet another advantage is that the method of the present invention can be used to form a micromechanical structure that is spaced away from the substrate by sufficient distance to substantially reduce a parasitic capacitance between the structure and the substrate.

Still another advantage is that the method of the present invention can be used to form a micromechanical device having lateral dimensions in the range of about one micron up to thousands of microns.

Another advantage of the method of the present invention is that micromechanical structures can be formed from single-crystal silicon, thereby providing improved mechanical strength, low stress improved electrical characteristics and/or improved light reflection characteristics as compared to structures formed from polysilicon.

Yet another advantage of the method of the present invention is that all process steps of the method can be carried out at temperatures below the melting point of aluminum, thereby allowing the fabrication of integrated circuitry on the substrate before or simultaneously with the process steps used to fabricate the micromechanical device.

These and other advantages of the method of the present invention will become evident to those skilled in the art.

SUMMARY OF THE INVENTION

The present invention relates to a micromachining method for forming a suspended micromechanical structure from crystalline silicon, with the structure having substantially planar and parallel upper and lower surfaces. The method comprises steps for providing a silicon substrate having a major surface aligned along a {111} crystal plane; forming a patterned mask layer over the major surface of the {111}-silicon substrate to define a substantially planar upper surface of the suspended structure to be formed in the substrate; etching portions of the substrate not covered by the patterned mask layer down to a first etch depth, thereby forming a plurality of exposed sidewalls of the suspended structure; forming a protection layer over the exposed sidewalls; etching the portions of the substrate not covered by the patterned mask layer down to a second etch depth greater than the first etch depth; and laterally undercutting the substrate between the first and second etch depths with an anisotropic wet etchant that terminates etching upon reaching a plurality of {111} crystal planes of the silicon substrate, thereby forming a substantially planar lower surface of the suspended structure that is substantially parallel to the upper surface.

The patterned mask layer can be formed by depositing and patterning a masking material such as photoresist, silicon dioxide, silicate glass, silicon nitride, a metal or a metal alloy. When the masking material is a hard material such as silicon dioxide, silicon nitride or silicate glass, it can further be patterned by providing a layer of patterned photoresist over the masking material and dry etching (e.g. reactive ion etching) through the hard masking material at the locations of openings in the patterned photoresist.

A preferred method for etching the substrate down to the first etch depth comprises an anisotropic dry etching method such as reactive ion etching which provides good feature resolution down to micron or sub-micron lateral dimensions, and which also forms the sidewalls of the micromechanical structure at an angle that is preferably about 90°. After forming the protection layer over the exposed sidewalls of the suspended structure using a fillet process (e.g. by depositing silicon dioxide, silicon nitride, silicate glass, a metal or metal alloy by chemical vapor deposition, or alternately forming a thermal oxide or thermal CVD nitride followed by an anisotropic reactive ion etching step). Another anisotropic dry etching step (e.g. by reactive ion etching) is preferably used to etch down through the substrate down to the second etch depth. (The term "thermal oxide" as used herein refers to a silicon dioxide layer formed over a portion or the entirety of the {111}-silicon substrate 12 by a thermal process whereby silicon from the substrate is converted into silicon dioxide by a reaction with oxygen in a moist environment at a high temperature in the range of about 800–1100° C.; and the term "thermal nitride" as used herein refers to a silicon nitride layer formed over a portion or the entirety of the {111}-silicon substrate 12 by a thermal chemical vapor deposition (CVD) process whereby a silicon-containing source gas such as silane ($SiH_4$) or $SiH_2Cl_2$ is reacted with ammonia ($NH_3$) in a temperature range of 700–1000 ° C. The first and second etch depths are defined as being measured from a top surface of the substrate, with the exact values of the first and second etch depths being determined by the type of suspended structure being formed and by the required separation of that structure from the underlying substrate.

The substrate material underlying the suspended structure being formed is partially or completely removed between the first and second etch depths by the undercutting etch step. The wet anisotropic etchant used for this undercutting etch step is preferably potassium hydroxide (KOH), or alternately tetramethyl ammonium hydroxide (TMAH) or ethylenediamine pyrocatechol (EDP). Other alkali hydroxide etchants including sodium hydroxide (NaOH) and cesium hydroxide (CsOH) can also be used for the undercutting etch step. During the undercutting etch step, the back surface of the substrate 12 can optionally be protected by a layer of a material that is resistant to chemical attack by the undercutting etchant (e.g. using a layer of thermal oxide or thermal nitride which can be formed at the same time as the protection layer 24).

The undercutting etch step with the wet etchant can be performed at a temperature in the range of 10–100° C., and preferably about 85° C. when KOH at a concentration of about 4–6 molar is used as the anisotropic wet etchant. After the undercutting etch step has been performed, a process step is preferably provided for removing the patterned mask layer and the protection layer with one or more selective etchants that do not substantially attack (i.e. etch) silicon.

The undercutting etch step can be timed and stopped before all the substrate material is removed underneath the suspended structure being formed, thereby forming a pedestal connecting the suspended structure to the substrate. The location of the pedestal underneath the suspended structure will, in general, depend on the orientation of an outline of the suspended structure being formed with respect to other of the {111} planes that are at angled with respect to the {111} plane at the surface of the substrate since the undercutting etch will slow down considerably upon reaching any angled {111} plane of silicon that extends across a lateral dimension of the structure. Thus, by appropriate positioning of the outline of the suspended structure being formed, a supporting pedestal can be formed either near the center of the structure or at one or more edges thereof. A suspended structure in the form of a cantilevered plate or beam can also be formed according to the present invention by either increasing the undercutting etch time, or by positioning the outline of the suspended structure being formed so that no angled {111} plane can be formed extending entirely across a lateral dimension of the substrate.

In some preferred embodiments of the present invention, one or more etch-stops can be formed at predetermined locations to limit a lateral extent of the undercutting etch process thereby controlling or stopping the undercutting etch step at predetermined locations. These etch-stops can be formed by etching one or more openings down through the substrate to a third etch depth that is greater than the second etch depth, with the third etch depth also being defined as measured from the top surface of the {111}-silicon substrate. An etch-stop can then be formed in these openings by forming or depositing one or more materials, including polysilicon, silicon dioxide, silicon nitride, silicate glass and combinations thereof. Once formed, the etch-stop is resistant to chemical attack by the wet etchant and serves to stop the lateral undercutting etching process at the location of the etch-stop. Preferably, the etch-stop also electrically insulates the suspended structure from the substrate. The shaped openings wherein one or more etch-stops are formed are either located within the outline of the suspended structure or outside the outline of the suspended structure and adjacent thereto, or both. The etch-stop can further form a support or hinge for portions or the entirety of the suspended structure.

Additionally, according to some embodiments of the present invention, steps can be provided for forming electronic circuitry on the substrate proximate to the suspended micromechanical structure. The electronic circuitry can comprise either bipolar circuitry, complementary metal-oxide semiconductor (CMOS) circuitry, or bipolar CMOS (BiCMOS) circuitry. The electronic circuitry comprising a plurality of interconnected transistors (i.e. bipolar transistors, CMOS transistors, or BiCMOS transistors) can be formed by a series of conventional process steps (including one or more steps for photolithography, masking, deposition, etching, ion implantation and/or thermal diffusion of dopants, thermal oxide formation, cleaning, stripping, metallization, passivation, etc. as known to the art) with modifications, if needed, due to the use of a {111}-silicon substrate rather than the {100}-silicon substrate normally used for forming integrated circuits (ICs). The process steps for forming the integrated circuitry can further include a step for forming electrical interconnections between the suspended micromechanical structure and the electronic circuitry (e.g. using polysilicon, a metal or a metal alloy electrical conductor). Furthermore, the steps for forming the electronic circuitry can include a step for forming a passivation layer over the electronic circuitry to protect the electronic circuitry from exposure to the anisotropic wet etchant.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

The micromachining method for forming a suspended micromechanical structure according to the present invention utilizes to advantage a uniform crystal lattice structure of semiconductor materials such as silicon. Conventional micromachining is based on the use of a {100}-oriented silicon substrate; whereas the present invention uses to advantage a completely different type of silicon substrate, namely a {111}-oriented silicon substrate.

The terminology for crystal planes and crystal lattice directions used herein is well-known in the art and can be found in any textbook on solid state or semiconductor physics. For example, see Chapter 1 entitled "Crystal Structure" of *Introduction to Solid State Physics* (3rd Edition, New York, 1966) by Charles Kittel which is incorporated herein by reference to indicate accepted terminology for describing crystal lattice nomenclature. See also, U.S. Pat. No. 5,709,773 to Field et al incorporated herein by reference, for crystal lattice nomenclature.

Figure 1A:
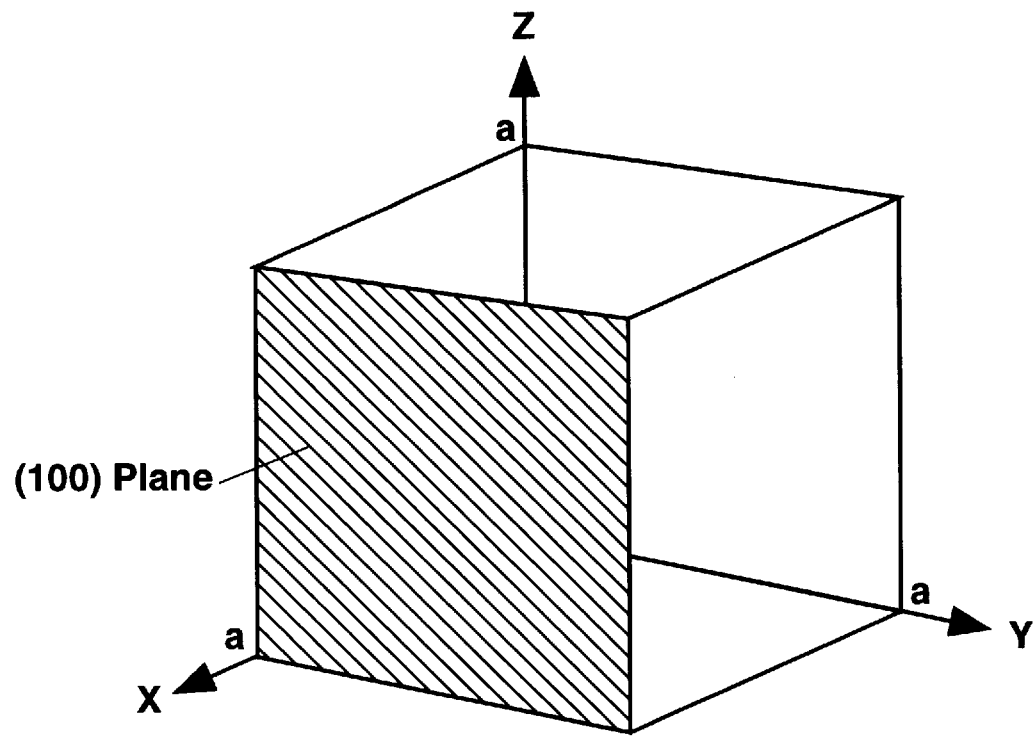
FIGS. 1a and 1b schematically illustrate a unit cell of a semiconductor crystal of silicon showing the location of a (100) plane and a (111) plane, respectively.

Within a uniform crystal such as silicon, there is a lattice structure having a high degree of symmetry. Conventional silicon micromachining utilizes a {100}-silicon substrate. This is a substrate which has a cubic lattice structure of unit-cell edge length, a, in each of three mutually orthogonal or cartesian axes in space designated by X, Y and Z. A lowest order set of crystal lattice directions aligned along the X, Y and Z axes includes a first member [100] directed along the X axis, a second member [010] directed along the Y axis, and a third member [001] directed along the Z axis. Based on symmetry considerations, a lowest order set of crystal lattice directions comprising the [100], [010] and [001] directions and equivalents thereto is by convention designated as a set of <100> directions. Similarly, a crystal plane is described by a vector orthogonal to a surface of the plane. A single crystal plane, denoted by (100) is shown in FIG. 1a; and a set of all planes orthogonal to the <100> crystal directions is by convention designated as a set of {100} planes.

Figure 1B:
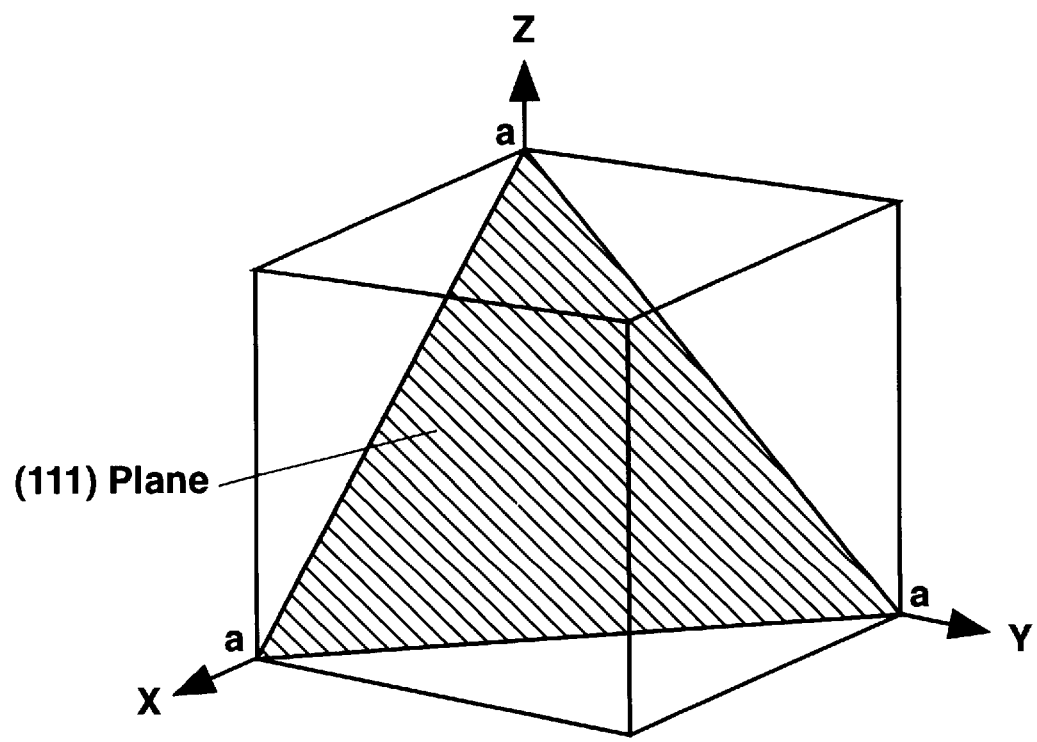

There exist yet other crystal lattice directions including a [111] lattice direction. The [111] lattice direction is oriented at an angle of about 54.7 degrees from the [100] lattice direction. A single crystal plane, denoted by (111) is shown in FIG. 1b; and a set of all planes orthogonal to the [111] lattice directions is designated as a set of {111} crystal planes. Planes in the {111} set are not orthogonal to each other, but are instead located at well-defined angles to each other as will be described hereinafter. Other sets of crystal planes also exist in monocrystalline silicon.

According to the method of the present invention, a monocrystalline silicon substrate 12 is provided having at least one major surface thereof that substantially coincides with a {111} crystal plane for forming a suspended micromechanical structure 10. The term micromechanical structure as used herein is intended to refer to any type of micromachined structure, including microelectromechanical structures, microelectrochemical structures and microoptomechanical structures. Thus, a micromechanical structure as defined herein can include any combination of mechanical functionality, electrical functionality, optical functionality and chemical functionality.

Figure 2A:
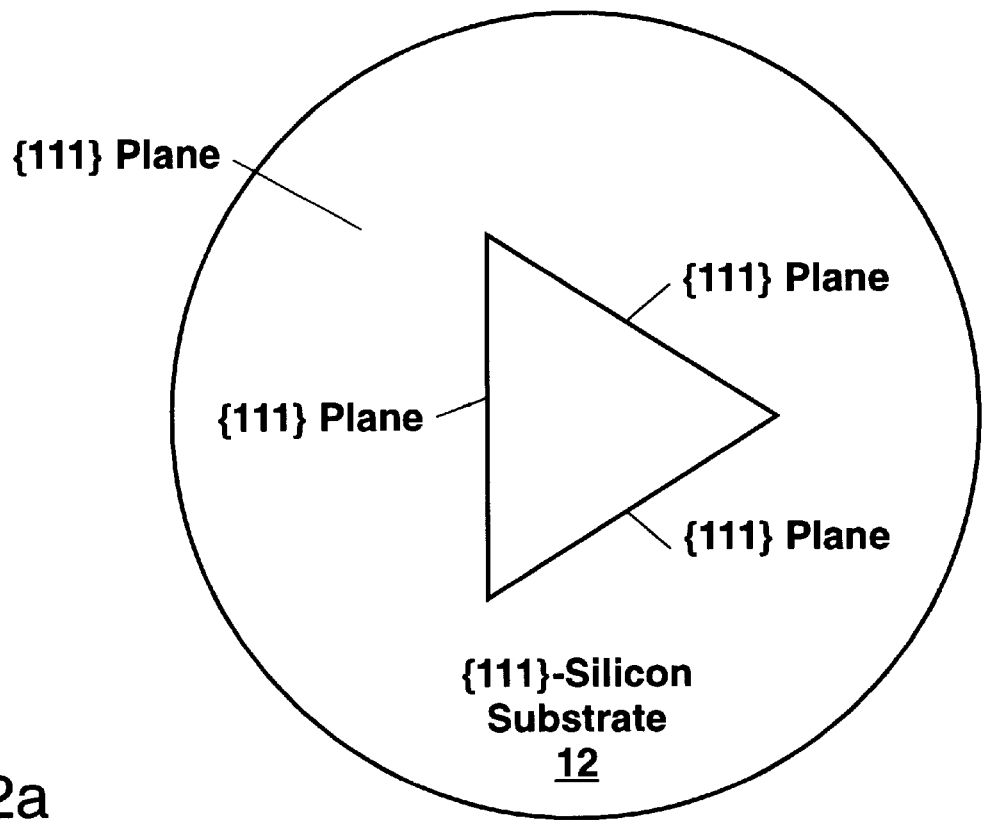
FIGS. 2a and 2b schematically illustrate a plan view and a cross-section view, respectively, of a {111}-silicon substrate co show the orientation of some of the {111} planes therein.
Figure 2B:
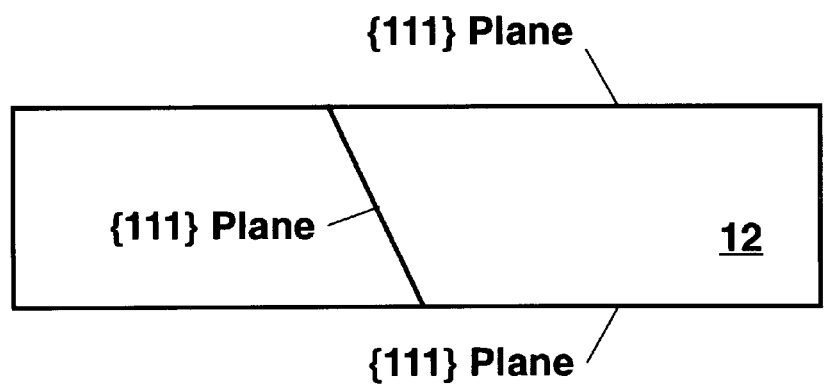

The {111}-silicon substrate is shown schematically in FIG. 2a, with one of the {111} planes corresponding with a top surface (i.e. a major surface) of the substrate, and with other of the {111} planes extending into the substrate at a non-orthogonal angle (i.e. an angle other than 90°) to the top surface and at fixed and well-known but non-orthogonal angles to each other. The three {111} planes shown in FIG. 2a that are not coplanar to the top surface of the substrate 12 intersect with each other at substantially 120° angles. FIG. 2b in cross-section shows that a back surface of the silicon substrate 12, if polished, can also be oriented to coincide with a {111} plane, and further shows the angle of a representative {111} plane extending downward into the substrate 12. This downward-extending {111} plane is angled with respect to the top surface of the substrate 12 by an angle of about 65°.

For many different types of micromechanical structures 10, what is needed is to form elements or members that have a pair of opposing surfaces that are substantially planar (i.e. parallel) to the top surface of the substrate 12 and to each other. Such substantially co-planar opposing surfaces can be used, for example, to form a plate, beam, linkage, gear, spring, carriage, electrostatic actuator, proof mass, moveable mirror, pressure diaphragm or the like. The micromachining method of the present invention utilizes the {111} crystal plane at the top surface of a {111}-silicon substrate 12 to form a first one of these parallel opposing surfaces (i.e. an upper surface 16 as shown in FIG. 3f), and further utilizes the same {111} crystal plane located at a position below the top surface and parallel thereto to form a second of these parallel opposing surfaces (i.e. a lower surface 20 as shown in FIG. 3f).

The method for forming the suspended micromechanical structure according to a first embodiment of the present invention can be understood with reference to FIGS. 3a–3f which schematically show a series of process steps of the present invention. It will be understood by those skilled in the art that the process steps described herein have been limited for clarity to only those steps that are essential for understanding the present invention and do not include other steps which are well known to the art of micromachining and, therefore, need not be described in detail herein.

Figure 3A:
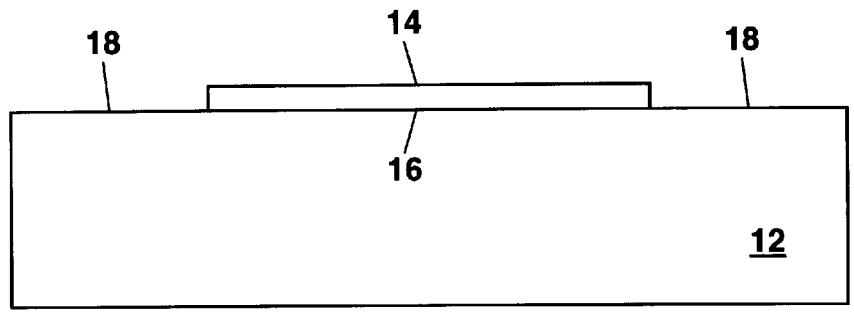
FIGS. 3a, 3b, 3c, 3d, 3e and 3f schematically illustrate a series of process steps that can be used to form a suspended micromechanical structure according to a first embodiment of the present invention.

FIG. 3a shows a {111}-silicon substrate 12 having a top surface formed from a first {111} crystal plane of silicon. It will be understood that, although the top surface is described as being co-planar with the first {111} crystal plane of silicon, this is difficult to achieve exactly so that the substrate 12 can be tilted at a slight angle (up to a few degrees) with respect to the first {111} crystal plane. In general, it is desired that the angle of tilt be as small as possible to achieve co-planarity of the pair of substantially parallel surfaces to be formed in the suspended structure 10 when this is critical for functionality of the device. Thus, depending upon a required degree of co-planarity of the pair of surfaces to be formed in the suspended structure 10, the angle of tilt of the top surface of the substrate 12 with respect to the first {111} crystal plane can vary by up to a few degrees. Additionally, manufacturing cost of the suspended structure 10 to be formed will be a factor in determining how close the substrate 12 should be in angle of tilt to the first {111} crystal plane since the cost for substrates 12 having a smaller angle of tilt will generally be more than those having a larger angle of tilt. The term substrate as used herein can include a silicon wafer of a predetermined size (e.g. 150 mm diameter), or a portion of a wafer of arbitrary size and shape. Finally, the substrate 12 can be doped (either n-type or p-type) with an impurity dopant at a concentration in the range of typically $10^{16}$–$10^{19}$ cm$^{-3}$; or else the substrate 12 can be semi-insulating (i.e. not intentionally undoped).

In FIG. 3a, a mask layer can be blanket formed over the substrate and subsequently patterned so that the patterned mask layer 14 covers a portion of the substrate outlining what will later become an upper surface 16 of the suspended micromechanical structure 10. The upper surface 16 preferably coincides with the first {111} crystal plane of the substrate 12. Remaining portions 18 of the top surface of the substrate 12 will be subsequently etched downward during the process steps for forming the suspended structure 10.

The patterned mask layer 14 in FIG. 3a can be formed by conventional steps for spinning on over the top surface of the substrate 12 a layer of a photoresist masking material (i.e. a photoresist), photolithographically exposing the photoresist with a mask pattern of light projected through a reticule (i.e. a photomask), and developing the exposed photoresist. Alternately, one or more masking materials selected from the group consisting of photoresist, silicon dioxide, silicon nitride, silicate glass, a metal or a metal alloy can be deposited on the top surface of the substrate 12 by conventional processes including thermal oxidation, spin-on deposition, chemical vapor deposition (CVD), plasma-enhanced chemical vapor deposition (PECVD), evaporation or sputtering. The masking materials can be photolithographically patterned and etched (e.g. by reactive ion etching) to form the patterned mask layer 14.

The masking material generally must be sufficiently thick or robust (i.e. hard and impervious to substantial attack by wet or dry etchants, including plasma etchants) to withstand later steps for etching down partway through the substrate 12. For this reason, a hard masking material such as silicon dioxide, silicon nitride or silicate glass can be preferred (e.g. about 100 nanometers of silicon nitride, or 500 nanometers of thermal oxide, or 500 nanometers of silicate glass deposited from the decomposition of tetraethylortho silicate, also termed TEOS, and densified by high temperature processing). After depositing the hard masking material, a photoresist can be spun-on over the hard masking material, with the photoresist then being patterned photolithographically to provide one or more openings through which the hard masking material can be etched (e.g. by an anisotropic dry etching step such as reactive ion etching with a $CHF_3$-based chemistry for a silicon nitride mask layer) down to the top surface of the substrate 12. The photoresist can then be either left in place during subsequent steps for etching down through the substrate 12 or removed to leave the hard patterned mask layer 14. In either case, the patterned mask layer 14 defines an outline and features of the suspended structure 10 to be formed in the substrate 12 by the subsequent etching steps.

In certain embodiments of the present invention wherein an electrically-conducting or light-reflecting metal or metal-alloy layer is to be provided over the upper surface 16 of the suspended structure 10, the metal or metal-alloy layer can be deposited directly over the upper surface 16 as a first layer of a composite mask layer 14 which can also include one or more additional layers of photoresist, silicon dioxide, silicon nitride and/or silicate glass to cover and protect the first layer during subsequent etching steps. These additional layers can later be stripped towards the end of fabrication of the suspended structure after the various etching steps to reveal the electrically-conducting or light-reflecting metal or metal-alloy layer.

Figure 3B:
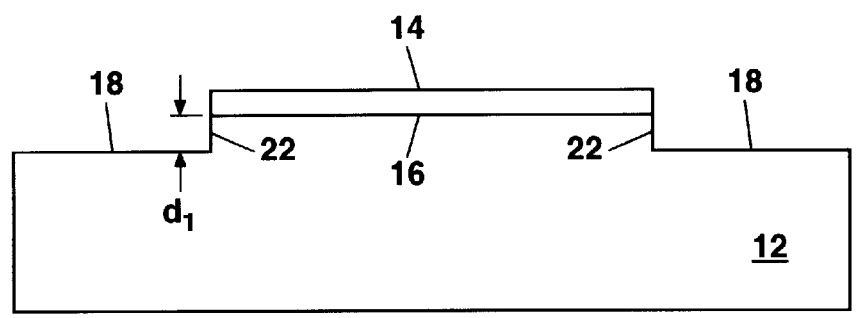
Figure 3C:
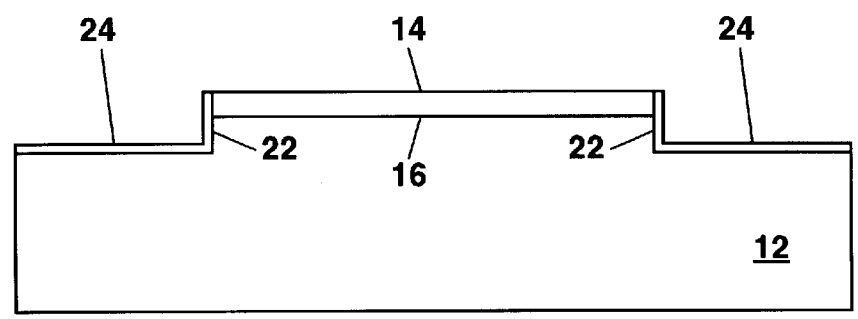
Figure 3D:
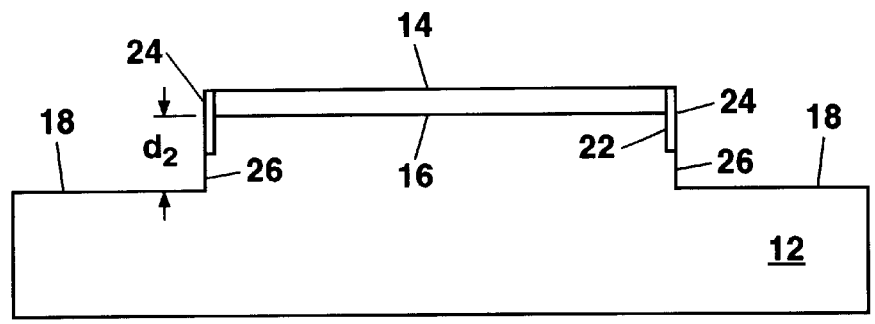
Figure 3E:
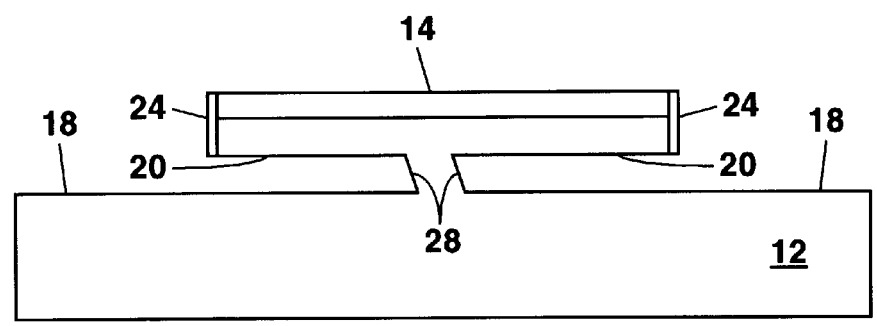
Figure 3F:
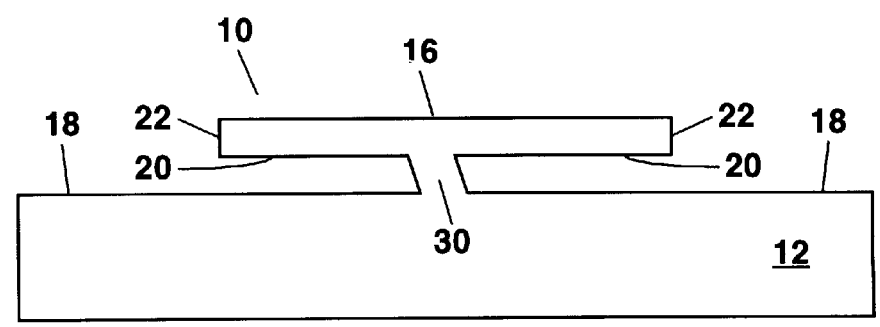

FIG. 3b shows the substrate 12 and patterned mask layer 14 after a first anisotropic dry etching step for etching downward into the substrate to a predetermined distance, $d_1$, which is substantially equal to the distance between the upper surface 16 and a lower surface 20 to be formed in the suspended structure 10 (see FIG. 3f). This first step for etching downward into the silicon substrate 12 can be performed, for example, using a composite patterned mask layer 14 comprising a 100-nm-thick layer of silicon nitride below a 1.0-$\mu$m-thick layer of photoresist. After photolithographically patterning the photoresist layer, the silicon nitride layer can be patterned by reactive ion etching using a $CHF_3$-based chemistry (e.g. using $CHF_3$ as a source gas to form a plasma). The silicon nitride layer can alternately be patterned using $Cl_2$ as the plasma source gas for the reactive ion etching step.

The exposed silicon substrate 12, in this example, can then be etched in an electrostatically-chucked electron cyclotron resonance (ECR) plasma etching apparatus using an $SF_6/O_2$ etch chemistry. To perform this step, the ECR plasma etching apparatus can be operated using 100 standard-cubic-centimeters per minute (sccm) of silicon hexafluoride ($SF_6$) gas and 20 sccm of oxygen ($O_2$) at a pressure of 14 milliTorr, a plasma current of 250 milliAmps incident on a 150-mm-diameter substrate 12 which is held by an electrostatic chuck maintained at a temperature of −30° C., and a radio-frequency (rf) power on the substrate of 15 Watts. Under these conditions, the exposed portion of the substrate 12 can be etched downward at a rate of about 3 $\mu$m/minute. The overall etch depth, $d_1$, can be, for example, between 5 and 20 $\mu$m, and in general will depend upon the type of suspended structure 10 being formed since this etching step forms a plurality of sidewalls 22 of the suspended structure 10 and also determines a thickness of the structure 10. After this etching step, the photoresist layer can be removed, leaving the silicon nitride layer covering the upper surface 16.

In FIG. 3c, the sidewalls 22 which are exposed as a result of the first step for etching the silicon substrate are subsequently covered with a protection layer 24 to protect the sidewalls from damage or erosion during further etching steps. Although only a vertically-disposed portion of the protection layer 24 that directly covers the sidewalls 22 is needed for protection thereof, it is often convenient to form the protection layer 24 as a conformal layer over all exposed portions of the silicon substrate 12 as shown in FIG. 3c, and subsequently remove a horizontally-disposed portion by a separate anisotropic dry etching step. Employing such a fillet process eliminates the need for a subsequent photolithography step.

The protection layer 24 can comprise, for example, a layer of silicon nitride formed by a thermal deposition process (e.g. by reacting $SiH_2Cl_2$ with $NH_3$ at a temperature of about 800° C. for about one hour at 200 milliTorr total pressure to form a silicon nitride layer thickness of about 100 nm). As another example, the protection layer 24 can comprise a layer of a thermal oxide (i.e. silicon dioxide formed by a thermal process whereby oxygen is reacted with silicon from the exposed portion of the substrate 12 and the sidewalls 22 at a temperature of about 900–1100° C. for sufficient time to provide a layer thickness of about 300 nm). Finally, the protection layer 24 can comprise any deposited or formed material that is substantially resistant to attack by a selective wet etchant (e.g. potassium hydroxide) that preferentially etches silicon and terminates etching along the {111} crystal planes of silicon. Thus, the protection layer 24 can comprise silicon dioxide, silicon nitride, or a silicate glass deposited by CVD or PECVD, or a metal (e.g. tungsten) or metal alloy (e.g. TiW or TiN) deposited by evaporation or sputtering. Tilting of the substrate 12 during deposition of the protection layer 24 can be used, if necessary, to ensure coverage of the sidewalls 22 by the vertically-disposed portion of the protection layer 24 to protect the sidewalls 22 during subsequent etching steps.

The horizontally-disposed portion of the protection layer 24, if present as shown in FIG. 3c, can be removed using anisotropic dry etching (e.g. reactive ion etching with a $CHF_3$-based plasma etchant for a silicon nitride, silicon dioxide or silicate glass protection layer 24).

A second anisotropic dry etching step can then be provided to etch downward through the substrate 12 to a predetermined second etch depth, $d_2$, as shown in FIG. 3d, exposing one or more vertical surfaces 26 of the silicon substrate 12. This second step for etching downward into the silicon substrate can be performed in the electrostatically-chucked ECR plasma etching apparatus using an $SF_6/O_2$ etch chemistry as described previously. The second etch depth, $d_2$, determines a separation between the suspended structure 10 to be formed and the underlying substrate 12, and can be, for example, about 5 to 20 microns, depending upon the particular type of suspended structure 10 being formed.

FIG. 3e shows schematically the result after an undercutting etch step in which a selective wet etchant is used to undercut the silicon substrate material between the first and second etch depths by etching laterally inward into the substrate 12 at the locations of the vertical surfaces 26. The selective wet etchant terminates etching, upon reaching a plurality of inside {111} crystal planes of the silicon substrate 12.

Since the exposed surface 18 comprises a {111} crystal plane, the selective wet etchant does not etch substantially downward into the substrate 12 beyond the surface 18. Furthermore, the protection layer 24 determines the location of another of the {111} crystal planes that is substantially co-planar with the exposed surface 18 and the upper surface 16 of the suspended structure 10 so that the selective wet etchant does not etch substantially upward beyond the bottom of the protection layer 24. As a result, the selective wet etchant is constrained by the locations of these two horizontal {111} planes to etch laterally inward into the substrate 12, thereby forming a planar lower surface 20 of the suspended structure 10 that is substantially parallel to the upper surface 16.

In FIG. 3e, the selective wet etchant etches laterally inward until etching is stopped at a predetermined time, or until the selective wet etchant reaches additional {111} crystal planes 28 which are angled with respect to the upper surface 16 whereupon the etching slows down considerably. In some embodiments of the present invention, the angled {111} crystal planes 28 can be located so as to form a pedestal 30 for supporting the suspended structure 10.

The selective anisotropic wet etchant used for the undercutting etch step can comprise potassium hydroxide (KOH), tetramethyl ammonium hydroxide (TMAH) or ethylenediamine pyrocatechol (EDP) at a temperature in the range of 10–100° C., with the etch rate increasing with temperature. Alternate selective anisotropic wet etchants that can also be used according to the present invention include sodium hydroxide (NaOH) and cesium hydroxide (CsOH). In the case of KOH as the selective anisotropic wet etchant, the KOH is preferably used at a concentration in the range of 4–6 molar and at a temperature of 85° C. In general, the etch rate for a particular anisotropic wet etchant will be a function of temperature, time and the etchant concentration. Each of the above selective wet etchants etches extremely slowly upon reaching a {111}-silicon plane while etching other crystal planes (e.g. the {100} crystal planes) in silicon much more rapidly. This inherent etch selectivity is used to advantage according to the present invention to form the suspended structure 10 which has a pair of substantially parallel surfaces 16 and 20 that are aligned along {111}-silicon planes as shown in FIG. 3f.

After the undercutting etch step in FIG. 3e, the patterned mask layer 14 and the protection layer 24 can be removed to complete formation of the suspended micromechanical structure 10 in a released condition as shown in FIG. 3f. The step for removing the patterned mask layer 14 and the protection layer 24 can be performed using one or more selective wet etchants (e.g. comprising hot phosphoric acid for silicon nitride, or hydrofluoric acid for silicon dioxide or silicate glass) that do not substantially attack (i.e. etch) silicon while etching away the materials forming the patterned mask layer 14 and the protection layer 24.

Figure 4:
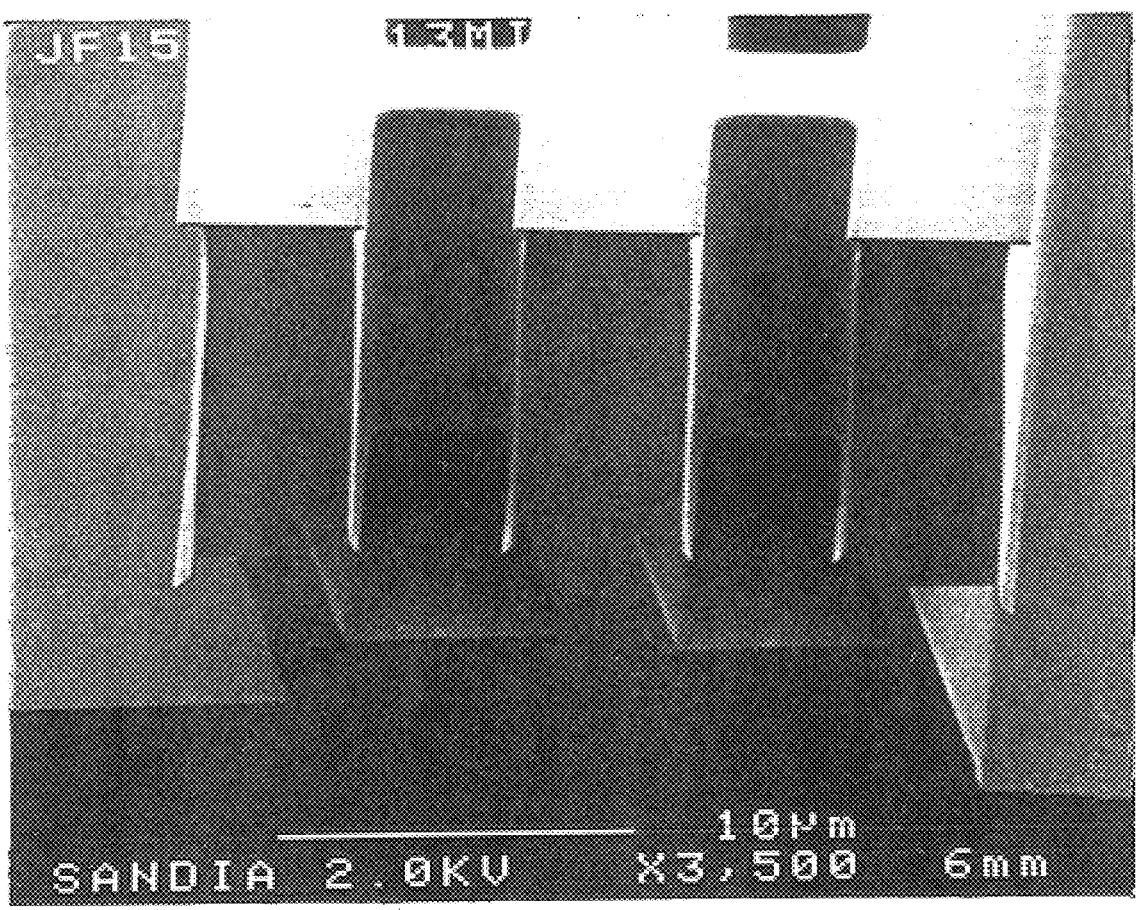
FIG. 4 is a scanning electron microscope (SEM) cross-section image of a partially undercut suspended structure formed according to the present invention to show the mask and protection layers, and also to show that different portions of a suspended micromechanical structure can be undercut to different depths.

FIG. 4 illustrates additional aspects of the method of the present invention related to the undercutting etch step. FIG. 4 shows an oblique cross-section scanning electron microscope (SEM) image of a portion of a suspended structure 10 taken after partially undercutting the structure with a selective wet etchant comprising KOH for 13 minutes. FIG. 4 shows that the second etch depth, $d_2$, can be varied at different regions of the suspended structure 10 to undercut the different regions to different depths. This can be useful for fabricating complicated suspended structures 10 which require that different portions of the structures 10 have different layer thicknesses or different separations from the underlying substrate. Additionally, this permits the formation of suspended structures 10 having a plurality of plates or beams that are suspended one above the other in a superposed relationship, or angled with respect to each other. Finally, the SEM image in FIG. 4 shows the orientation of the angled {111} crystal planes with respect to the horizontal {111} planes.

Figure 5:
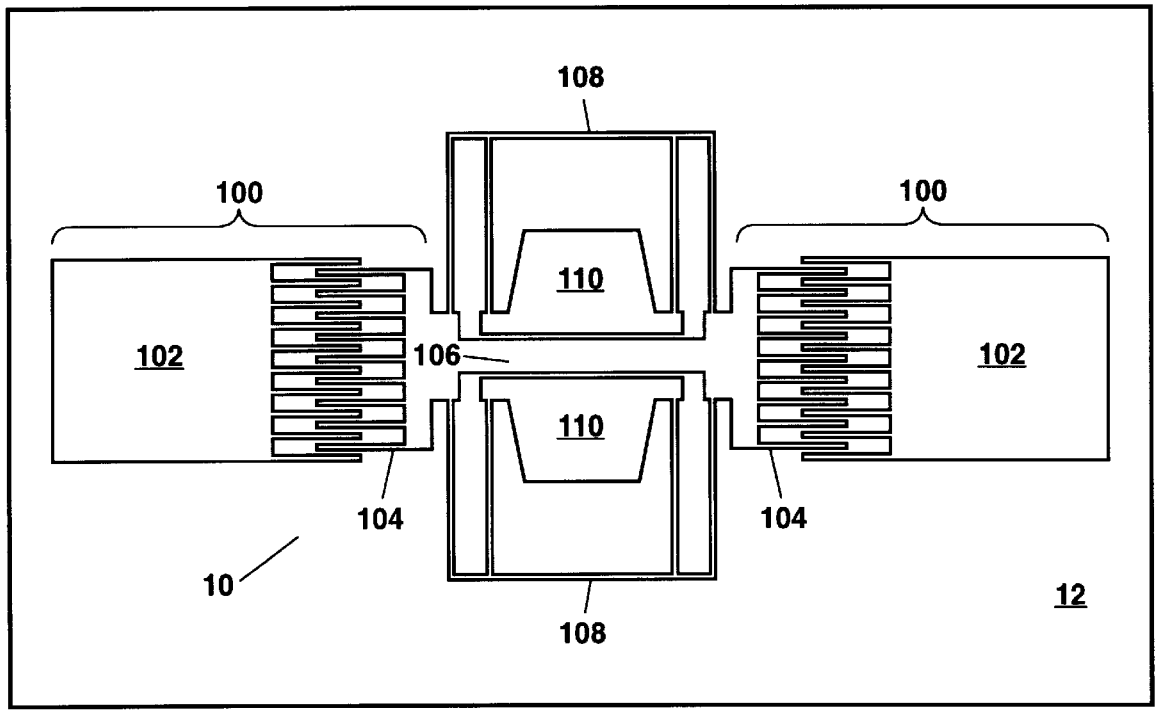
FIG. 5 shows a schematic plan view of an accelerometer structure fabricated in {111}-silicon according to the present invention.

FIG. 5 shows a schematic plan view of a suspended structure 10 in the form of an accelerometer fabricated on a silicon substrate 12 according to the present invention. In FIG. 5, the accelerometer 10 comprises a pair of variable capacitors 100, with each variable capacitor 100 further comprising a fixed comb 102 and a moveable comb 104. The two moveable combs 104 in FIG. 5 are connected together by a linkage 106 to form a shuttle mass that is unconnected to the substrate 12 except through springs 108 and supports 110. An acceleration can be sensed by the accelerometer using external circuitry to sense a change in capacitance of the variable capacitors 100 in response to motion of the moveable combs 104. In other embodiments of the present invention the capacitance-sensing circuitry can be fabricated on the same substrate or chip with the accelerometer 10.

Figure 6A:
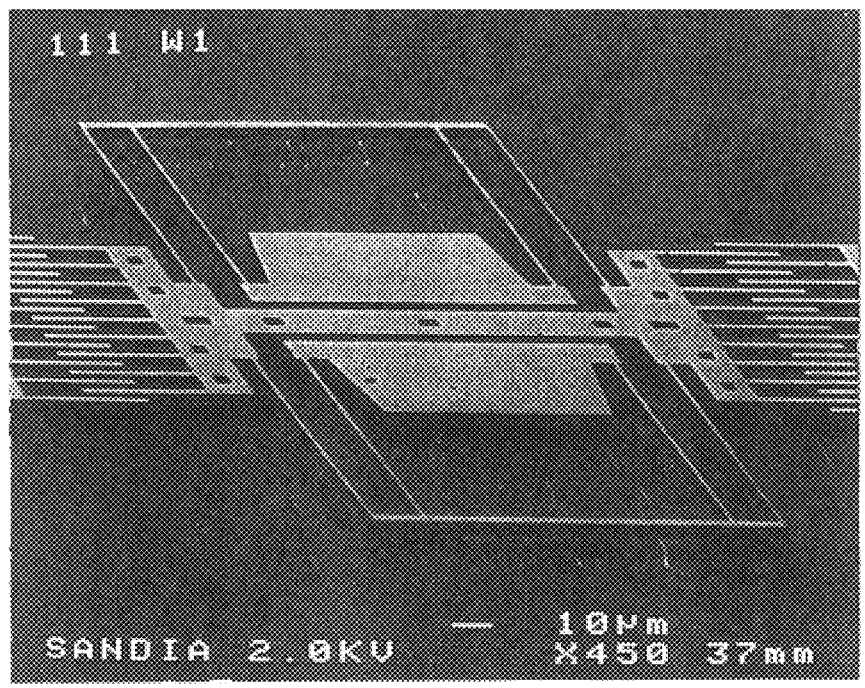
FIGS. 6a and 6b show SEM images of portions of the accelerometer of FIG. 5 as fabricated in {111}-silicon using the method of the present invention.
Figure 6B:
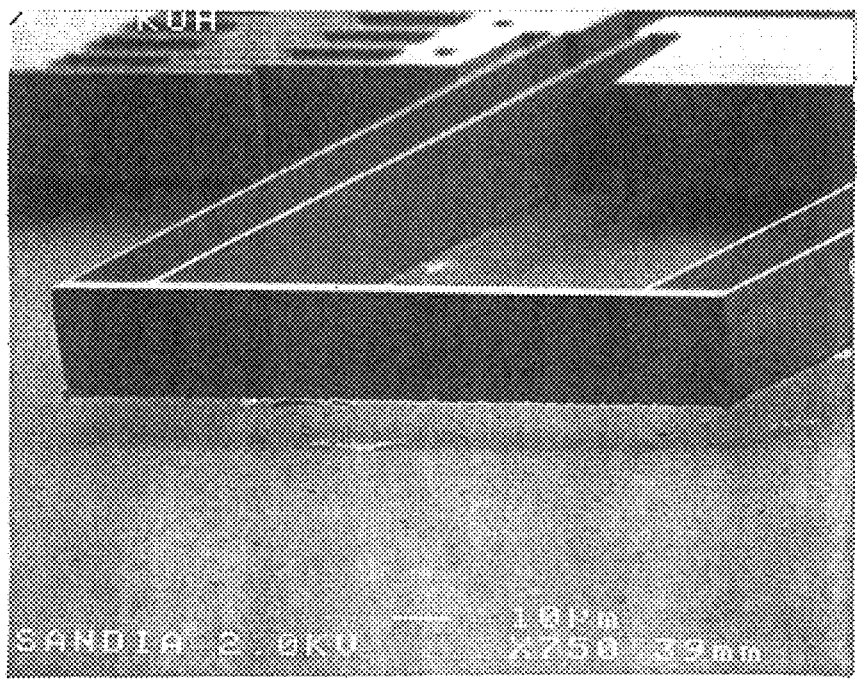

FIGS. 6a and 6b show SEM images of portions of the accelerometer 10 of FIG. 5 as fabricated in {111} crystalline silicon using the method of the present invention. In FIG. 6a, the separation of the moveable combs 104 and the springs 108 and a plurality of fingers of the fixed combs 102 from the substrate 12 can be seen. FIG. 6b shows this in greater detail, and also shows a partial undercutting of the supports 110 which remain connected to the substrate 12 by a pedestal 30 which is not visible. The accelerometer structure 10 in FIGS. 6a and 6b is about 25 μm thick and is spaced from the underlying substrate by about 8 μm.

Figure 7A:
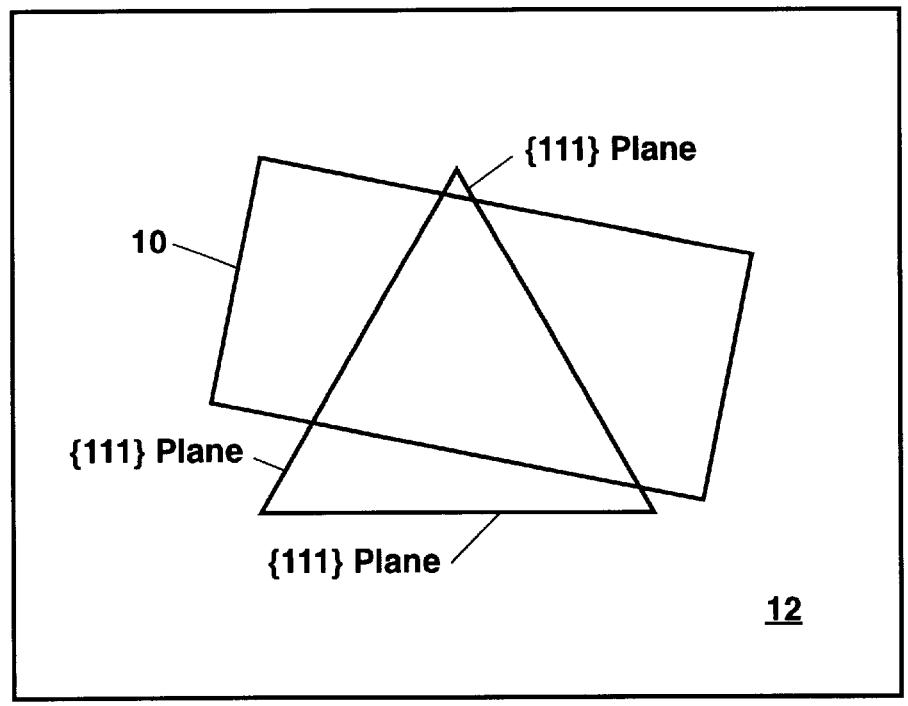
FIGS. 7a and 7b schematically illustrate different approaches that can be used according to the present invention to orient the outline of a suspended structure to be formed with respect to angled {111} planes in the {111}-silicon substrate, or to prevent the undercut etch from terminating at the locations of the angled {111}-silicon planes.
Figure 7B:
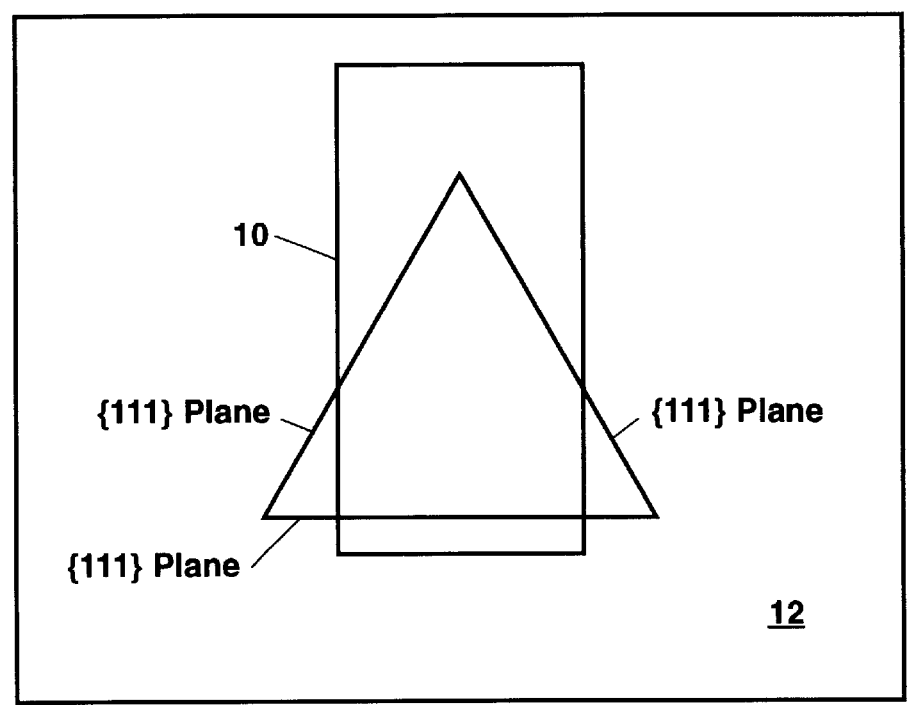

FIGS. 7a and 7b illustrate schematically different approaches that can be used according to the present invention to orient the outline of a suspended structure 10 to be formed with respect to angled {111} planes in the {111}-silicon substrate, or to prevent the undercut etch from terminating at the locations of the angled {111} planes. FIG. 7a shows schematically in plan view three angled {111} crystal planes of silicon that extend downward into the {111}-silicon substrate 12 as described heretofore with reference to FIGS. 2a and 2b. Since the undercutting etch slows down considerably upon reaching these angled {111}-silicon planes, the suspended micromechanical structure 10 can be positioned to advantage on the substrate 12 at a predetermined orientation to these angled {111}-silicon planes. Such positioning of the structure 10 can be used to provide for either undercutting the structure 10 to form the lower surface 20 supported on a pedestal 30 as described heretofore with reference to FIGS. 3a–3f, or to form the lower surface 20 of a cantilevered structure 10.

In FIG. 7a, the suspended structure 10 is positioned with respect to the three angled {111}-silicon planes so that no straight-line edges of the structure 10 are parallel to the angled {111}-silicon planes. This is not a major design constraint since most suspended micromechanical structures are based on orthogonal layouts, while the angled {111}-silicon planes have a three-fold symmetry as shown in FIG. 7a. When none of the angled {111}-silicon planes are parallel to the straight-line edges of the structure, the undercutting etch (e.g. KOH) will continue until the etch is terminated at a particular time. Thus, by timing the undercutting etch a pedestal 30 can be formed to support the suspended structure 10. Otherwise, the undercutting etch will continue and will completely undercut the suspended structure 10 which must then be supported by other means such as one or more etch-stops described hereinafter.

FIG. 7b shows an alternate approach in which one of the angled {111}-silicon planes is lined up parallel to one of the straight-line edges of the suspended structure 10 to be formed in the substrate 12. In this case, the undercutting etch step will slow down considerably upon reaching this angled {111}-silicon plane; and this can be used to form a cantilevered plate or beam structure 10. In some cases, it may be possible to line up more than one of the angled {111}-silicon planes with straight-line edges of a suspended structure 10 (e.g. when the structure 10 has a pair of edges intersecting at 120° angles).

Figure 8A:
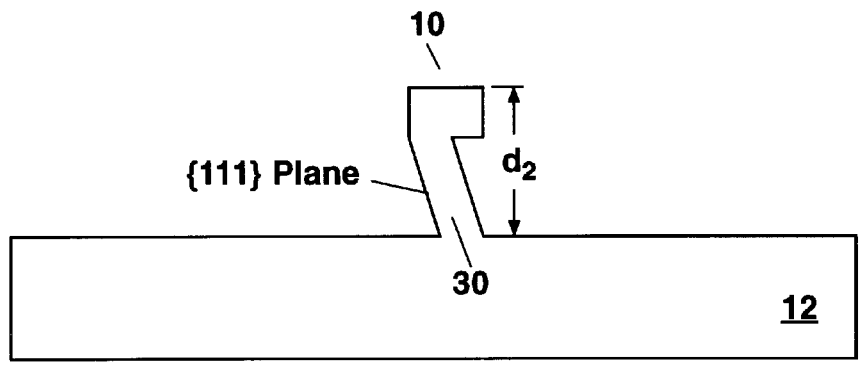
FIGS. 8a, 8b and 8c show schematic cross-section views to illustrate another approach for completely undercutting a suspended micromechanical structure 10, or one or more features therein.
Figure 8B:
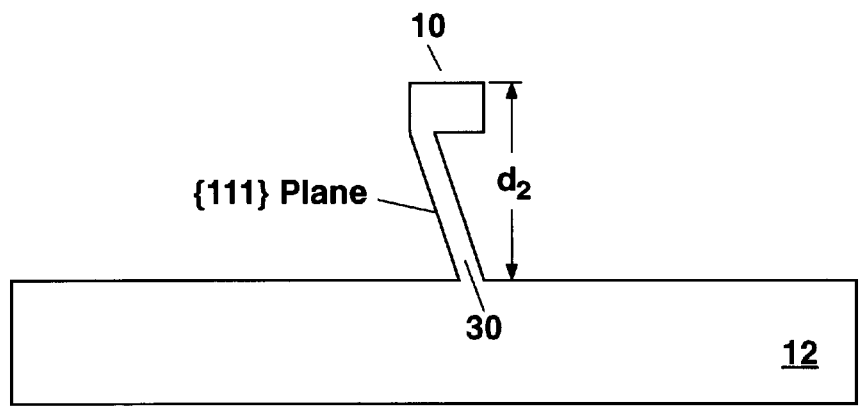
Figure 8C:
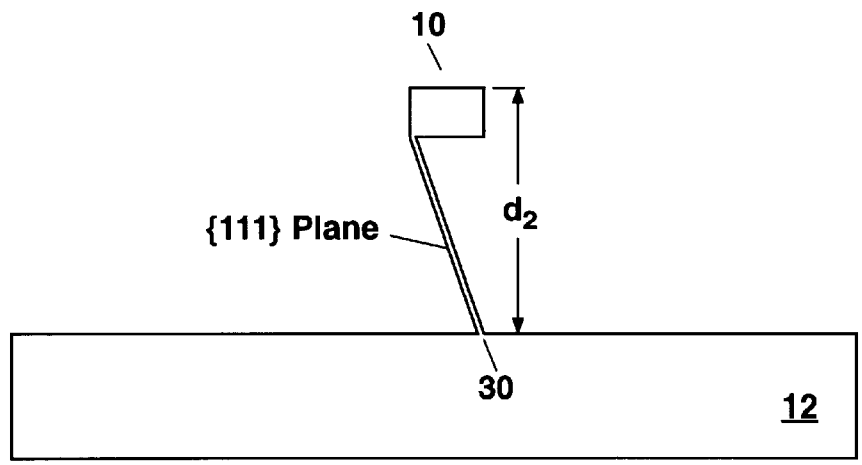

FIGS. 8a–8c show in schematic cross-section view another approach for completely undercutting a suspended micromechanical structure 10, or one or more features therein. In FIG. 8a, the structure 10 or features therein are undercut by the selective anisotropic wet etchant (e.g. KOH) until one or more angled {111}-silicon planes is exposed over an undercut area of the substrate exposed by the second etch depth, $d_2$, whereupon the etching is slowed down considerably or terminated, thereby forming a pedestal 30 for supporting the suspended structure 10. In FIG. 8b, if the second etch depth, $d_2$, is increased by a given amount the undercutting etch proceeds inward to a greater extent than before in order to completely expose the angled {111}-silicon plane(s) over the undercut area determined by the second etch depth, $d_2$. This results in a thinner pedestal 30 as shown in FIG. 8b.

In FIG. 8c, further increasing the depth, $d_2$, further decreases the width of the pedestal 30 formed by termination of the undercut etch upon fully exposing the angled {111}-silicon plane(s) over the undercut area determined by the second etch depth, $d_2$. If the second etch depth, $d_2$, is increased still further beyond that shown in FIG. 8c, a point will soon be reached at which the suspended structure 10 is completely undercut. Thus, by selecting the second etch depth, $d_2$, to be sufficiently large compared to a width of the upper surface 16 of the suspended structure 10 being formed or compared to the width of one or more features therein, it will be possible to completely undercut the structure 10 or the features therein. In this case, other means will generally be provided to support the structure 10 (e.g. using one or more etch-resistant features formed of silicon nitride, silicon dioxide, silicate glass, metals, metal alloys or combinations thereof). It will also be understood by those skilled in the art that the second etch depth, $d_2$, can be maintained at a fixed value; and the width of the suspended structure 10 or features therein can be preselected to have sufficiently narrow lateral dimensions to provide the same effect for completely undercutting and releasing the structure 10 or the features therein.

In some preferred embodiments of the present invention, it is preferable to provide one or more etch-stops to terminate the undercutting etch step at precise locations rather than relying on the undercutting etch to stop at the angled {111} silicon planes. One reason for this is that any pedestal 30 formed by the undercutting etch has a plurality of outside corners where the angled {111}-silicon planes intersect each other or other crystalline planes of the silicon. While the selective etching process terminates or slows down considerably along the {111}-silicon planes, the etching can continue at these outside corners, thereby continuing to etch away at the pedestal 30. This is different from selective etching along angled {111}-silicon planes to form a plurality of inside corners (e.g. as in the formation of an inverted pyramid-shaped etch pit due to intersecting {111} planes in a {100}-oriented silicon wafer that can be formed by exposure of the top surface of the wafer to KOH) for which the selective etching effectively terminates when the inside corners intersect each other.

Figure 9A:
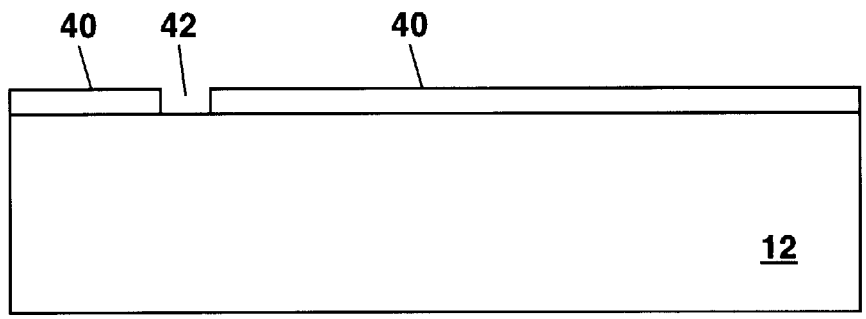
FIGS. 9a, 9b, 9c, 9d, 9e, 9f, 9g, 9h, 9i, 9j, 9k, 9l, 9m and 9n schematically illustrate a series of process steps that can be used to form a suspended micromechanical structure 10 according to a second embodiment of the present invention.
Figure 9B:
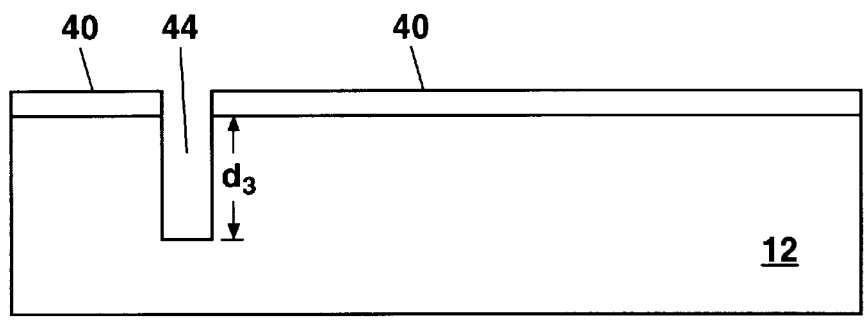
Figure 9C:
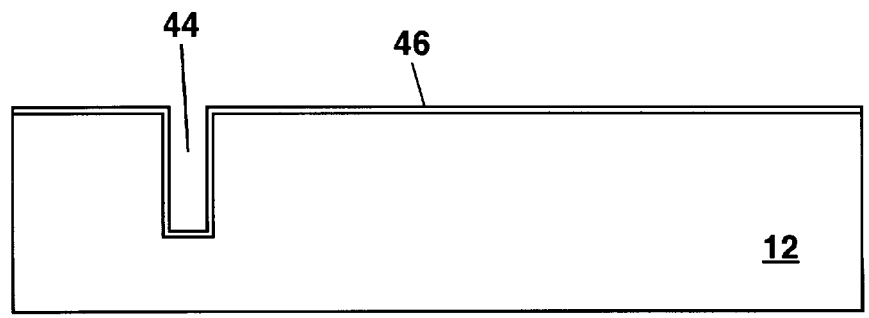
Figure 9D:
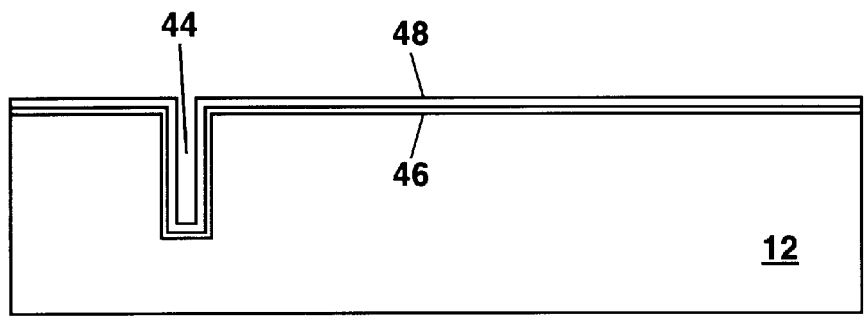
Figure 9E:
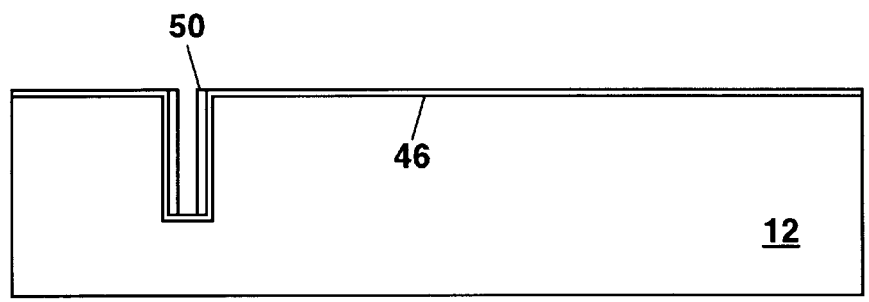
Figure 9F:
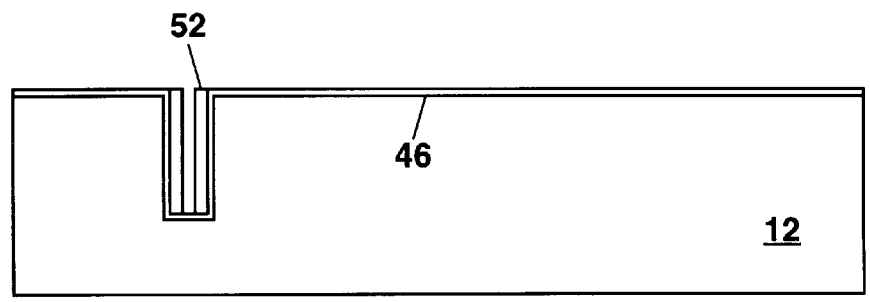
Figure 9G:
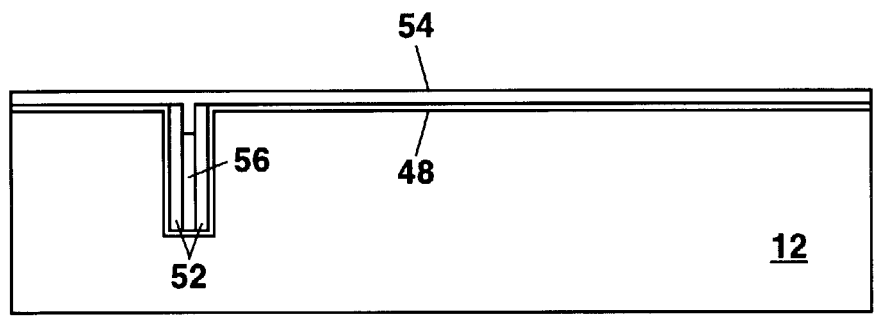
Figure 9H:
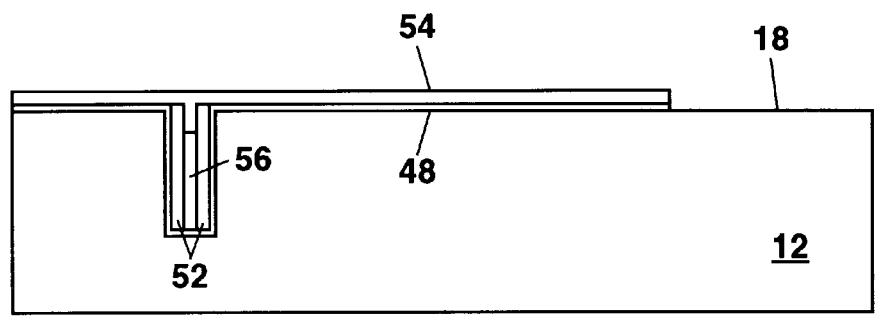
Figure 9I:
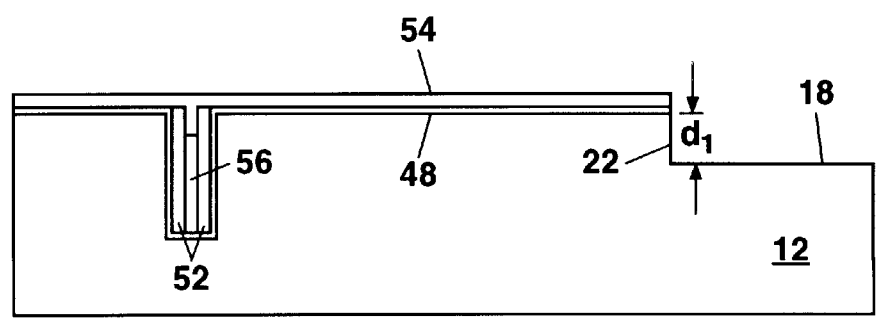
Figure 9J:
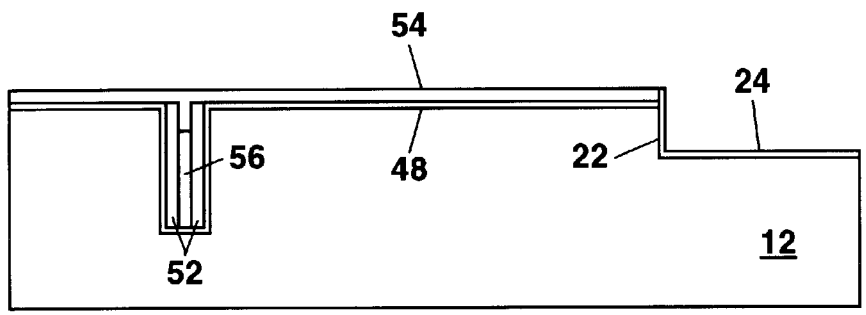
Figure 9K:
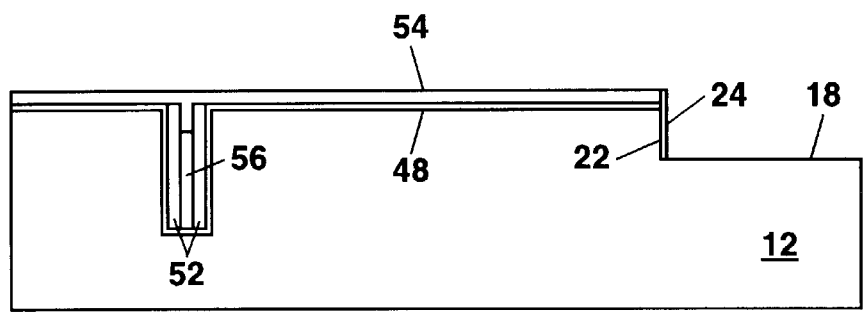
Figure 9L:
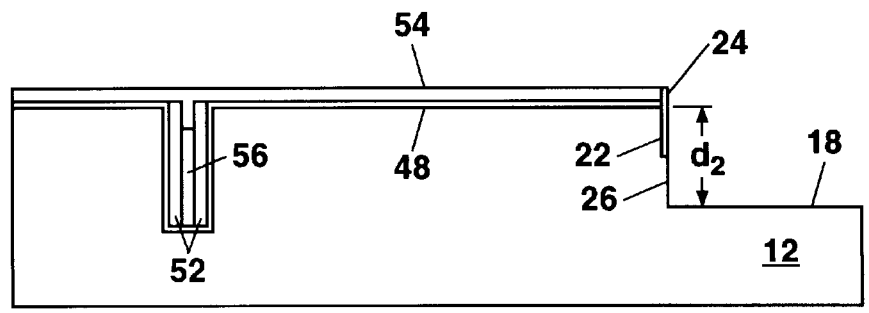
Figure 9M:
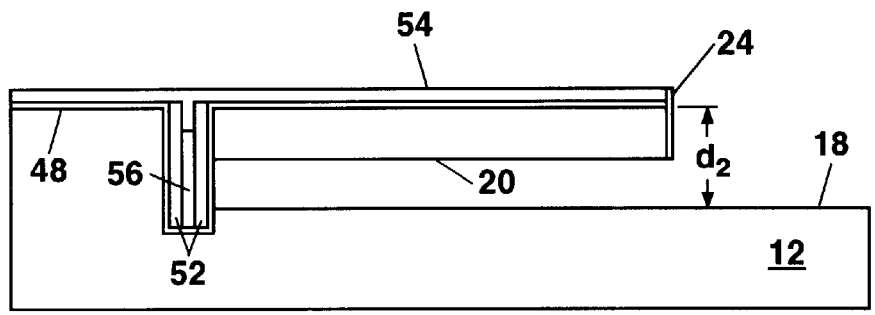
Figure 9N:
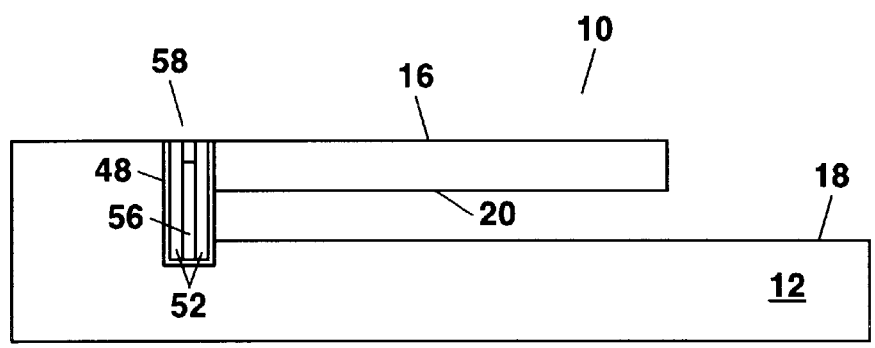

FIGS. 9a–9n schematically illustrate a series of process steps that can be used to form a suspended micromechanical structure 10 according to a second embodiment of the present invention which provides for formation of one or more etch-stops to terminate the undercutting etching step at predetermined locations within or adjacent to the suspended structure 10.

In FIG. 9a, a mask layer 40 is formed over the top surface of the {111}-silicon substrate 12 and patterned to provide an opening 42 through to the top surface at the location of each etch-stop to be formed. The mask layer 40 can be formed in a manner similar to mask layer 14 in FIG. 3a.

In FIG. 9b, a shaped opening 44 (e.g. a well or trench) is formed adjacent to an outline of the suspended structure 10 to be formed in the {111}-silicon substrate 12. The shaped opening 44 is anisotropically dry etched down to a third etch depth, $d_3$, which is greater than the second etch depth, $d_2$, that will subsequently be used to define a spacing between the suspended micromechanical structure 10 being formed and the underlying substrate 12 (see FIG. 9L). The shaped opening 44, which defines a size and shape for the etch-stop to be formed, can be made using an anisotropic dry etching process such as ECR plasma etching with an $SF_6/O_2$ etch chemistry as previously described with reference to FIG. 3b. After etching the shaped opening 44 down to the third etch depth, $d_3$, the mask layer 40 can be removed from the substrate 12.

In FIG. 9c, a thin layer (about 100 nm thick) of silicon nitride 46 is formed over the top surface of the substrate 12 and in the shaped opening 44. This is preferably done by forming a thermal CVD nitride as described heretofore with reference to FIG. 3c. This layer of silicon nitride 46 is used to protect the {111}-silicon substrate 12 from oxidation during a subsequent step for converting a deposited polysilicon layer into a thermal oxide for forming the etch-stop.

In FIG. 9d, a layer of polysilicon 48 is blanket deposited over the substrate 12 and in the shaped opening 44 by CVD or PECVD. The polysilicon layer 48, in general, will depend upon a width of the shaped opening 44 since the polysilicon will be converted into a thermal oxide for use in filling the shaped opening 44. Typically, the thickness of the polysilicon layer 48 will be about one-fifth to one-sixth the width of the shaped opening 44. Thus, for a 5-μm-wide opening 44, a layer thickness of about 1 μm of polysilicon can be used.

In FIG. 9e, the layer of polysilicon 48 can be removed from the top surface of the substrate 12 and from the bottom of the shaped opening 44 using anisotropic dry etching (e.g. ECR plasma etching using a $Cl_2$ chemistry). This leaves a fillet 50 of polysilicon on each sidewall of the shaped opening 44 as shown in FIG. 9e.

In FIG. 9f, the polysilicon fillets 50 are converted to silicon dioxide fillets 52. This step is performed by exposing the polysilicon to oxygen in a moist ambient at a temperature in the range of 1000–1100° C. for sufficient time to convert the polysilicon to silicon dioxide. This thermal oxidation process increases the width (i.e. the layer thickness) of the fillets, thereby further filling in the shaped opening 44.

In FIG. 9g, a layer 54 of silicon dioxide or silicate glass can be deposited over the substrate 12 by CVD or PECVD for use in forming a patterned etch mask and to fill in the shaped opening 44. Deposition of the layer 54 can, in some instances, plug the shaped opening 44 to leave a void 56 as shown in FIG. 9g. Such a void 56 will generally not adversely affect the utility of the etch-stop, or its mechanical strength for use as a support for the suspended structure 10 being formed in the {111}-silicon substrate 10.

In FIG. 9h, the layer 54 in combination with the layer 44 of silicon nitride can be photolithographically patterned to form a composite mask layer. This composite mask layer can then be used for etching down into the substrate to a first etch depth, $d_1$, as shown in FIG. 9i to define one or more sidewalls 22 of the suspended structure 10 being formed. Etching into the substrate 12 to the first etch depth, $d_1$, can be performed as described heretofore with reference to FIG. 3b using an ECR plasma etching apparatus with $SF_6$ and $O_2$ source gases.

In FIG. 9j, a protection layer 24 is formed over the exposed portion 18 of the silicon substrate 12 and the sidewalls 22 as described heretofore with reference to FIG. 3c. In FIG. 9k, a horizontally-disposed portion of the protection 24 is removed by anisotropic dry etching to leave a vertically-disposed portion to protect the sidewalls 22 from later attack by a selective anisotropic wet etchant (e.g. KOH).

In FIG. 9l, the exposed portion 18 of the substrate 12 is etched down to the second etch depth, $d_2$, as measured from the top surface of the substrate 12, thereby creating one or more exposed vertical surfaces 26 of the substrate 12. This etching step is preferably performed using an anisotropic dry etching process such as the ECR plasma etching process using $SF_6$ and $O_2$ source gases as described heretofore with reference to FIGS. 3b and 3d.

In FIG. 9m, an undercutting etch step is performed with a selective anisotropic wet etchant as described heretofore with reference to FIG. 3e. This undercutting etch step removes the substrate material between the first and second etch depths, stopping at the horizontal {111}-silicon planes that are substantially co-planar with the top surface of the substrate 12. The etching also proceeds laterally inward from one or more exposed vertical surfaces 26 of the silicon substrate 12 and terminates upon reaching each etch-stop.

In FIG. 9n, formation of the suspended micromechanical structure 10 is completed and released by removing the protection layer 24 and the layers 48 and 54. This can be done, for example, by using one or more one or more selective wet etchants that do not substantially attack (i.e. etch) silicon while etching away the materials forming the protection layer 24 and the layers 48 and 54 (e.g. using hot phosphoric acid for any silicon nitride layers, or using hydrofluoric acid for any silicon dioxide or silicate glass layers), or by using a combination of wet and dry etching to selectively remove particular of the layers 24, 48 and 54.

The etch-stop can be either removed by the selective wet etchants, or left in place to form a support 58 for the suspended structure 10. The resulting support 58 is preferably formed from a combination of materials (e.g. silicon nitride in combination with silicon dioxide and possibly including a silicate glass) that are electrically insulating so that the support 58 can act as an electrical standoff to insulate the suspended structure 10 from the underlying substrate 10.

In FIG. 9n, the suspended structure 10 is shown as a cantilevered plate or beam supported at a predetermined distance above the substrate 12 by the support 58. Those skilled in the art will understand that this second embodiment of the present invention can be used to form many different types of suspended micromechanical structures 10, with one or more etch-stops formed either within or without an outline of the structures 10, or both. Furthermore, this second embodiment of the present invention has advantages in providing a precise and reproducible control over the undercutting etch step, and in allowing the formation of portions of a suspended structure 10 which are electrically insulated from the underlying {111}-silicon substrate 12 for use as contact pads or mechanical stops.

Figure 10:
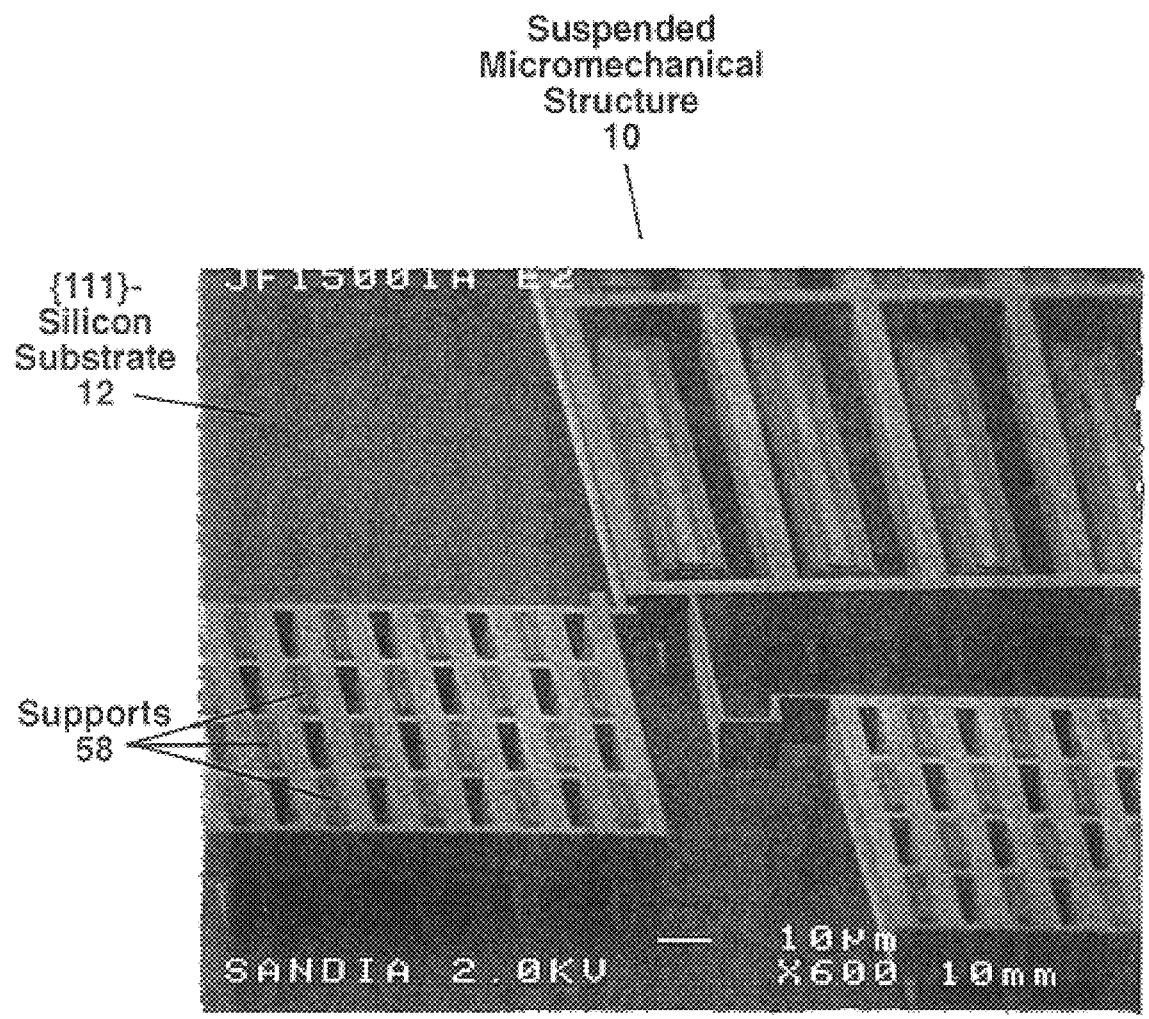
FIG. 10 shows an oblique SEM image of a portion of a suspended micromechanical structure showing a plurality of etch-stops formed to support portions of the structure under which the silicon has been completely removed during the undercutting etch step.

FIG. 10 shows an oblique SEM image of a portion of an example of a suspended micromechanical structure 10 in the form of an electrostatic actuator that can be formed according to the second embodiment of the present invention. In FIG. 10, various fixed and moveable elements of the structure 10 are formed of {111} silicon from a {111}-silicon substrate 12, and are supported on the substrate by a plurality of spaced insulating plug supports 58 formed as described heretofore with reference to FIGS. 9a–9n. In FIG. 10, the undercutting etch step was performed using a solution of 4-molar KOH at 85° C. with a 15 minute etch duration.

The method of the present invention can also be integrated with conventional steps for forming bipolar electronic circuitry, complementary metal-oxide-semiconductor (CMOS) electronic circuitry or bipolar CMOS (BiCMOS) electronic circuitry, thereby forming an integrated micromechanical structure 10. The integration of the suspended micromechanical structure with electronic circuitry comprising a plurality of interconnected transistors to implement a particular circuit design can provide added functionality and sensitivity, and reduced size and cost compared to a suspended structure 10 formed on a separate substrate 12 from the electronic circuitry.

Figure 11:
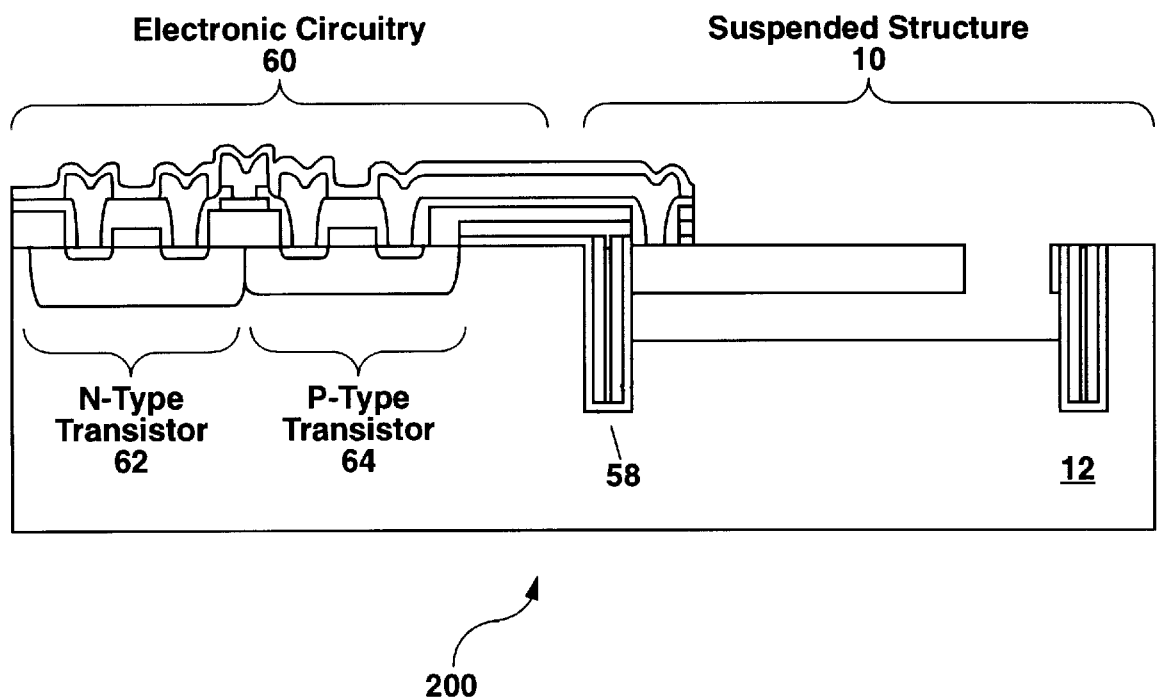
FIG. 11 shows a schematic cross-section view of a suspended micromechanical structure integrated with electronic circuitry on a common substrate according to a third embodiment of the present invention.

FIG. 11 shows a schematic cross-section illustration of an example of an integrated device 200 formed according to a third embodiment of the present invention. The integrated device 200 in FIG. 11 comprises at least one suspended micromechanical structure 10 fabricated on a first portion of a common {111}-silicon substrate 12 and electrically connected to electronic circuitry 60 fabricated on a second portion of the same substrate proximate to the first portion. In the example of FIG. 11, the first portion of the substrate 12 lies below the bracket and label "Suspended Structure 10"; whereas the second portion lies below the bracket and label "Electronic Circuitry 60". A series of process steps for forming an integrated device 200 according to the third embodiment of the present invention are schematically illustrated in FIGS. 12a–12r and described hereinafter.

In a preferred method for forming the integrated device 200, one or more etch-stops can be initially formed and buried as shown in FIGS. 12a–12g. Then the electronic circuitry 60 is formed on the substrate 12 and buried below one or more passivation or protection layers 68 as shown in FIGS. 12h–12k. Finally, the suspended structure 10 is formed as shown in FIGS. 12l–12r.

Figure 12A:
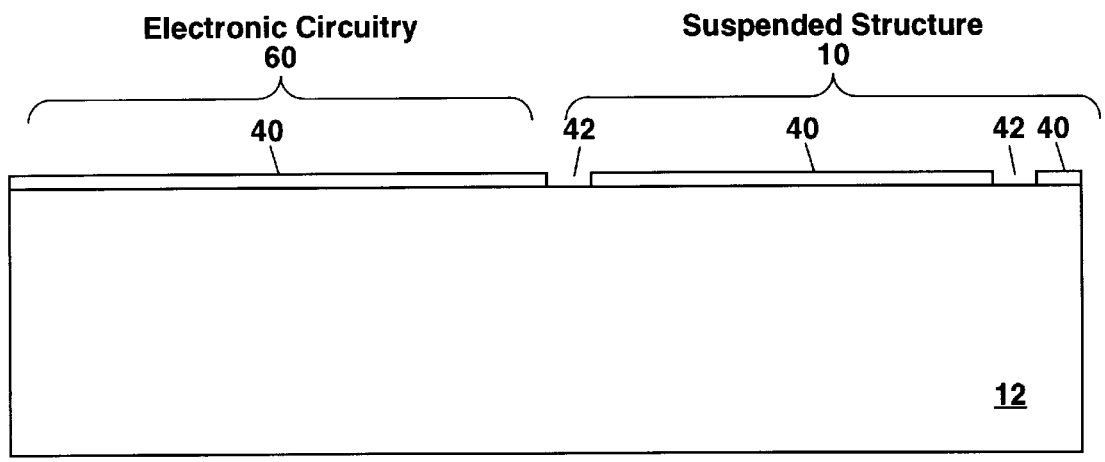
FIGS. 12a, 12b, 12c, 12d, 12e, 12f, 12g, 12h, 12i, 12j, 12k, 12l, 12m, 12n, 12o, 12p, 12q and 12r schematically illustrate a series of process steps that can be used to form the suspended micromechanical structure integrated with electronic circuitry according to the third embodiment of the present invention.

In FIG. 12a, formation of the etch-stops begins by providing a patterned mask layer 40 over the top surface of the {111}-silicon substrate 12 with one or more openings 42 at the locations of the etch-stops to be formed. The patterned mask layer 40 can be formed as described previously with reference to FIGS. 3a and 9a. The openings 42 can be connected to outline the suspended micromechanical structure 10 to be formed.

Figure 12B:
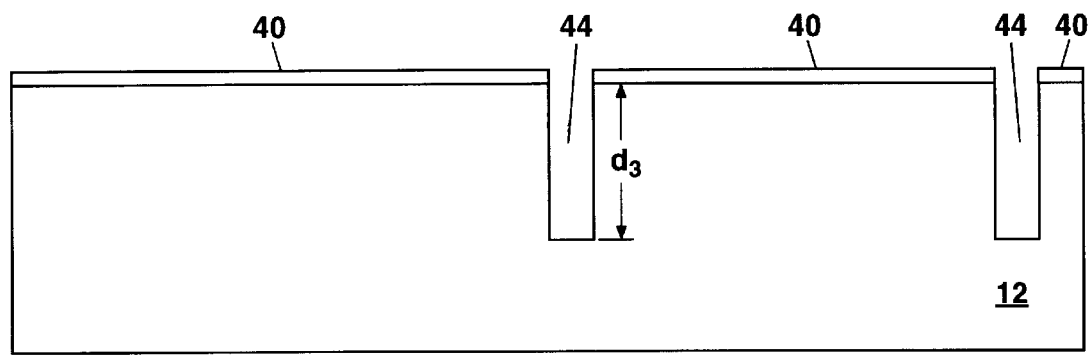

In FIG. 12b, interconnected trenches 44 can be formed by etching down into the {111}-silicon substrate 12 to outline the suspended micromechanical structure 10 to later be formed. The trenches 44 are preferably anisotropically dry etched down to the third etch depth, $d_3$, as previously defined using, for example, an ECR plasma etch with an $SF_6/O_2$ etch chemistry. After this etch step, the mask layer 40 is stripped.

Figure 12C:
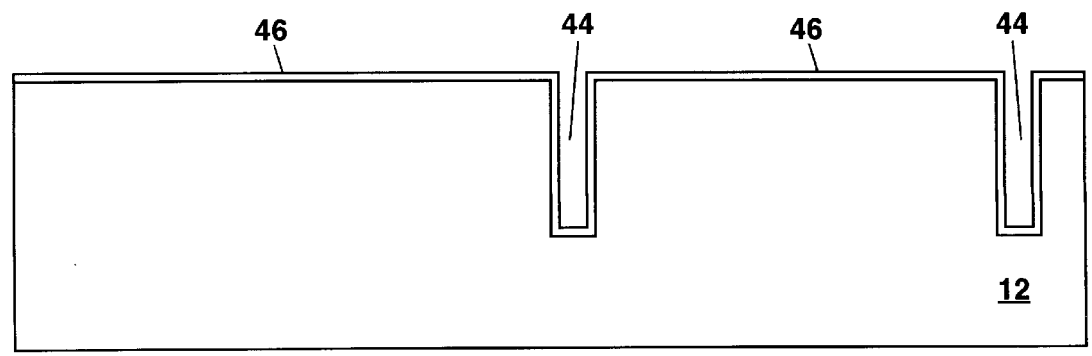
Figure 12D:
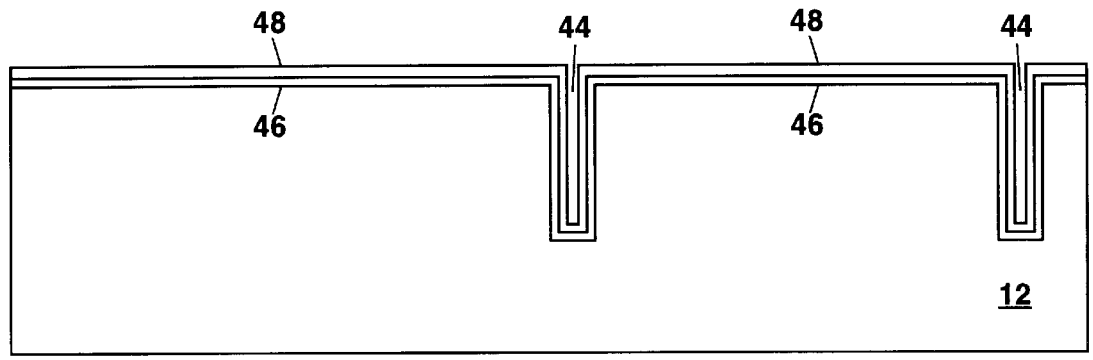
Figure 12E:
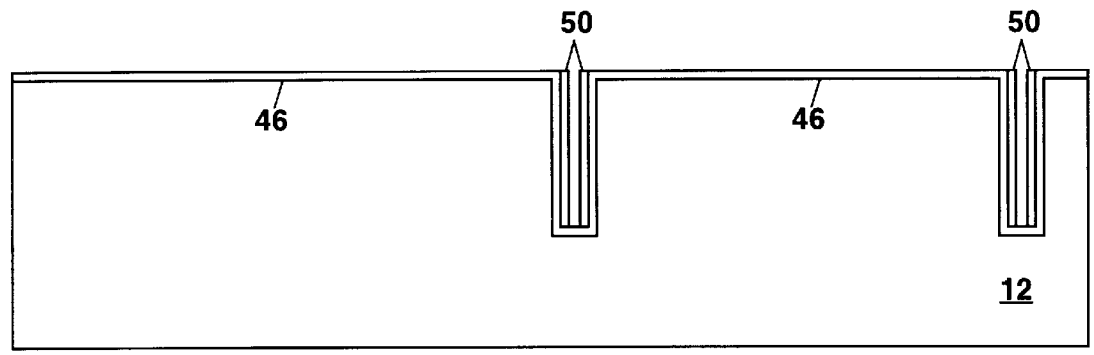

In FIG. 12c, a thin layer of silicon nitride 46 is formed over the top surface of the substrate 12 and in the trenches 44 as described with references to FIGS. 3c and 9c. A layer of polysilicon 48 can then be blanket deposited over the substrate 12 and in the trenches 44 by CVD or PECVD as shown in FIG. 12d and as previously described with reference to FIG. 9d. In FIG. 12e, portions of the polysilicon layer 48 are removed from the top surface of the substrate 12 and from the bottom of the trenches 44 by anisotropic dry etching as described with reference to FIG. 9e, thereby leaving filets 50 of polysilicon on each sidewall of the trenches 44.

Figure 12F:
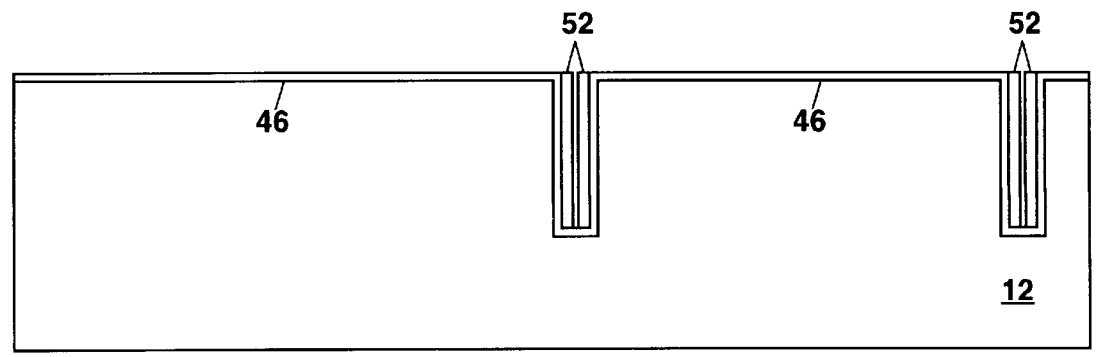
Figure 12G:
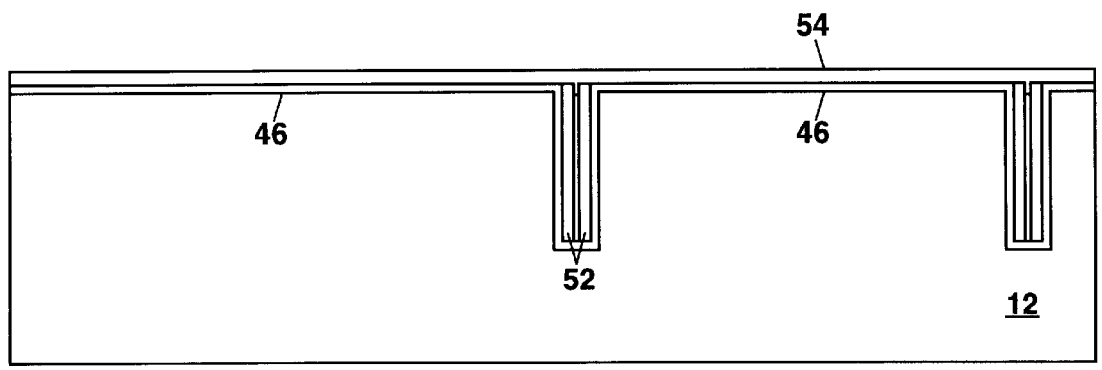

In FIG. 12f, the fillets 50 of polysilicon are converted to silicon dioxide fillets 52 with a corresponding change in width using a thermal oxidation process as described with reference to FIG. 9f. In 12g, the etch-stops are completed by depositing a layer 54 of silicon dioxide or silicate glass over the substrate 12 by CVD or PECVD to cover and seal the trenches 44.

Figure 12H:
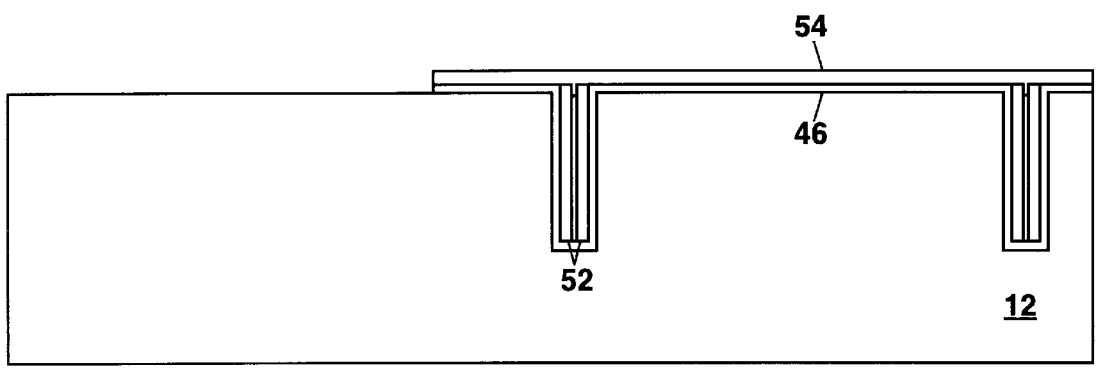

In FIG. 12h, the layers 46 and 54 are removed down to the bare substrate 12 at one or more locations where the electronic circuitry 60 is to be formed. At this point, a series of conventional process steps can be used for forming bipolar circuitry, CMOS circuitry, or BiCMOS circuitry. These process steps, described herein with reference to the formation of CMOS circuitry, can begin with formation of a thin layer (about 30–40 nm) of thermal oxide (i.e. silicon dioxide formed by a thermal process) over the exposed surface of the substrate 12 followed by blanket deposition of about 120 nm of a second silicon nitride layer (not shown). Alternately, the layers 46 and 54 can be removed down to the substrate 12 by chemical-mechanical polishing prior to formation of the thermal oxide layer and the second silicon nitride layer.

In FIG. 12h, openings can be formed through the second silicon nitride layer for forming n-type and p-type isolation wells (also termed tubs) by ion implantation and thermal diffusion steps. Subsequent standard CMOS process steps can be used for forming n-type transistors 62 within the p-type wells, and for forming p-type transistors 64 within the n-type wells. Such standard CMOS process steps can include the deposition and patterning of one or more polysilicon layers for forming transistor gates and resistors 66; and the deposition and patterning of a plurality of passivation layers 68 (including, for example, a field oxide layer of CVD silicon dioxide and overlying layers of one or more silicate glasses such as tetraethylortho silicate, also termed TEOS; phosphorous silicate glass, also termed PSG; or borophosphorous silicate glass, also termed BPSG deposited by CVD or PECVD). Additionally, one or more contact openings 70 can be etched down to the {111}-silicon substrate 12 or to a metal or metal alloy layer (not shown) in preparation for forming one or more electrical interconnections between the electronic circuitry 60 and the suspended micromechanical structure 10 to be formed.

Figure 12I:
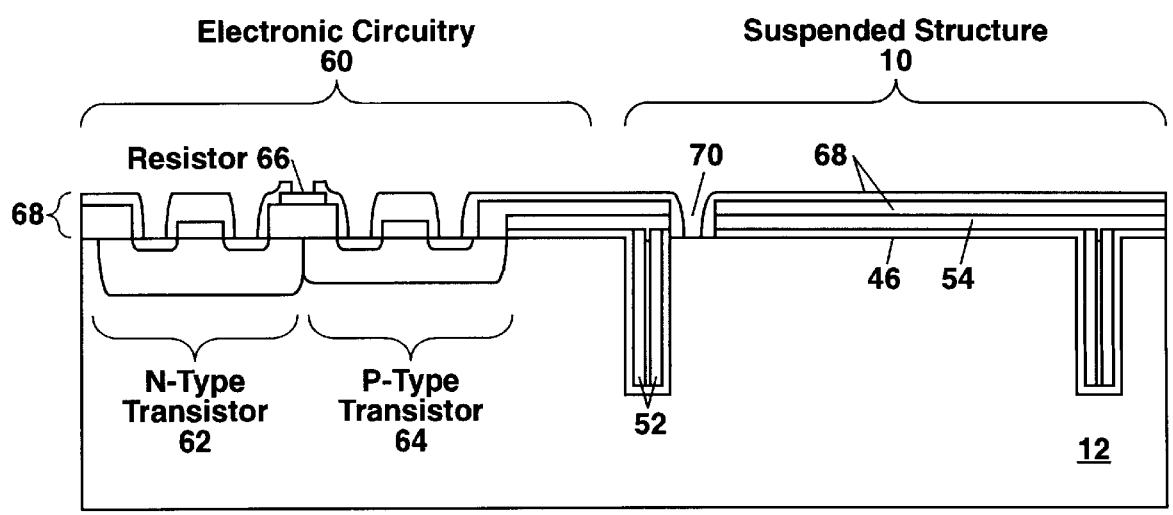
Figure 12J:
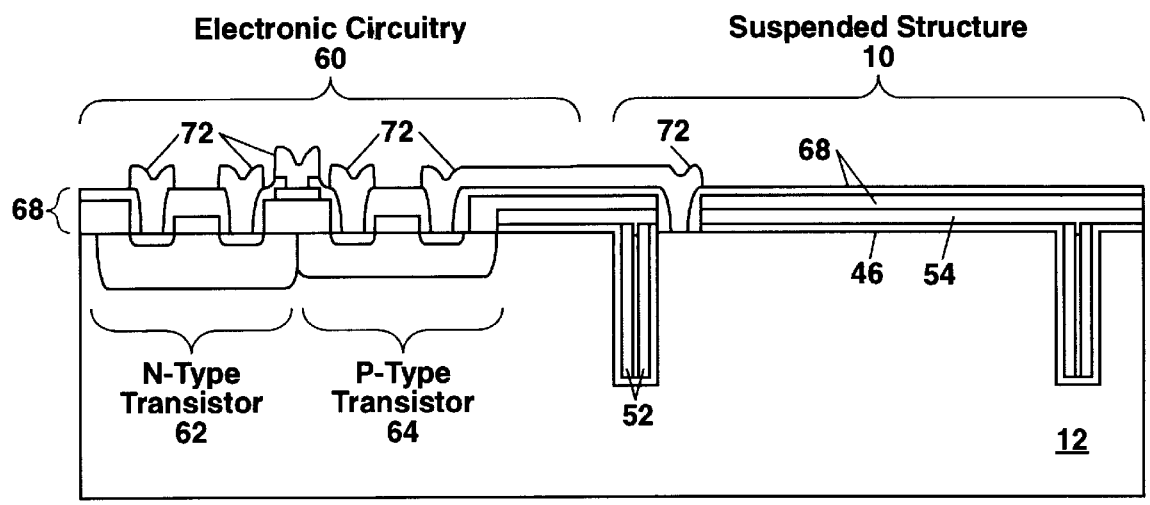
Figure 12K:
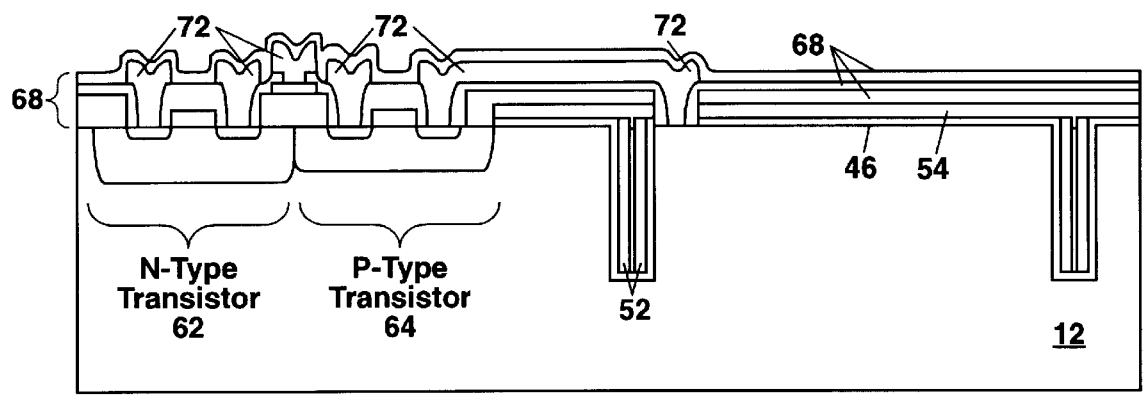

The standard process steps used for forming the electronic circuitry 60 in FIGS. 12i–12k can include repeated steps for photolithography, masking, deposition, etching, ion implantation and/or thermal diffusion of dopants, thermal oxide formation, cleaning, stripping, metallization, passivation, etc. as known to the art of semiconductor integrated circuit fabrication. In some instances, slight modifications may be needed, for example, to adjust an ion implantation energy for n-type or p-type dopant ions to compensate for the difference in crystal orientation of the {111}-silicon substrate 12 as compared with the energy generally used for a conventional {100}-silicon substrate. Such modifications, however, are minor and can be learned through practice of the present invention.

In FIG. 12j, one or more layers of electrical interconnections 72 are provided by standard deposition and patterning steps to interconnect elements (e.g. transistors, resistors, capacitors) forming the electronic circuitry 60, to provide electrical interconnections to the suspended micromechanical structure 10, and to provide a plurality of bonding or contact pads (not shown) for providing electrical connections to form a packaged integrated device 200. The electrical interconnections 72 are considered herein to form a part of the electronic circuitry 60.

Aluminum or an alloy thereof is preferred for use as an interconnect metallization for forming the electrical interconnections 72, although other metals (e.g tungsten, gold, copper, platinum, nickel, palladium), metal alloys (including metal silicides) and even doped polysilicon can be used depending upon particular operating requirements for the integrated device 200, and a particular set of standard process steps to be used for practice of the present invention.

In FIG. 12k, one or more additional passivation layers 68 are provided as needed to separate multiple layers of electrical interconnections 72 and to protect the electronic circuitry 60 during subsequent steps for forming the suspended micromechanical structure 10.

Figure 12L:
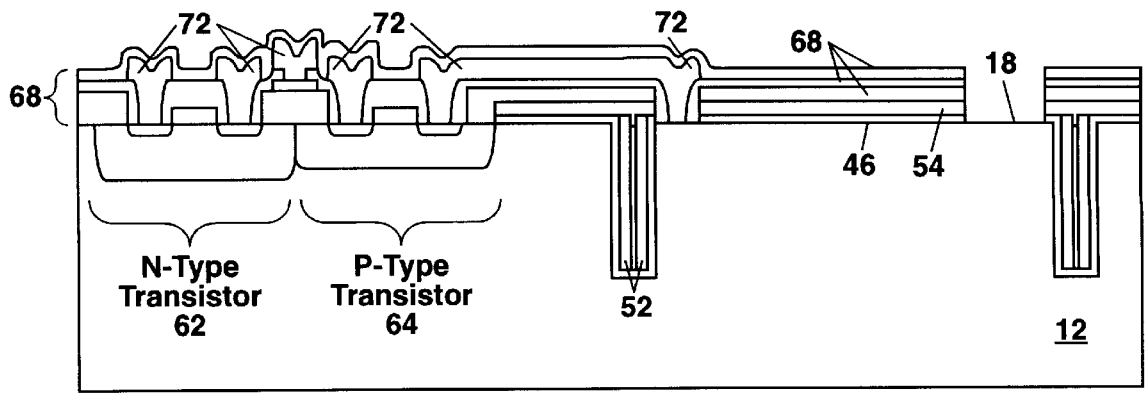
Figure 12M:
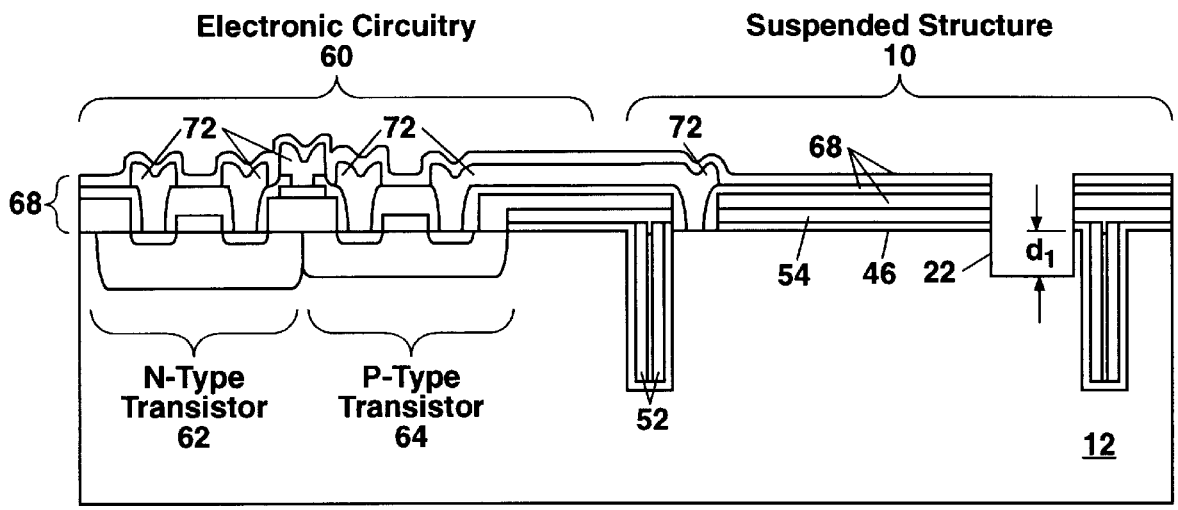

In FIG. 12l, the layers 46, 54 and 68 are photolithographically patterned by anisotropic dry etching to form a composite mask layer and to expose a portion 18 of the top surface of the {111}-silicon substrate 12 as described with reference to FIGS. 3a and 9h. In FIG. 12m, the exposed portion 18 is etched downward to the first etch depth, $d_1$, as described heretofore with reference to FIGS. 3b and FIG. 9i. This etch step, which can be performed using an ECR plasma etching apparatus with an $SF_6/O_2$ etch chemistry, defines one or more sidewalls 22 of the suspended structure 10 being formed.

Figure 12N:
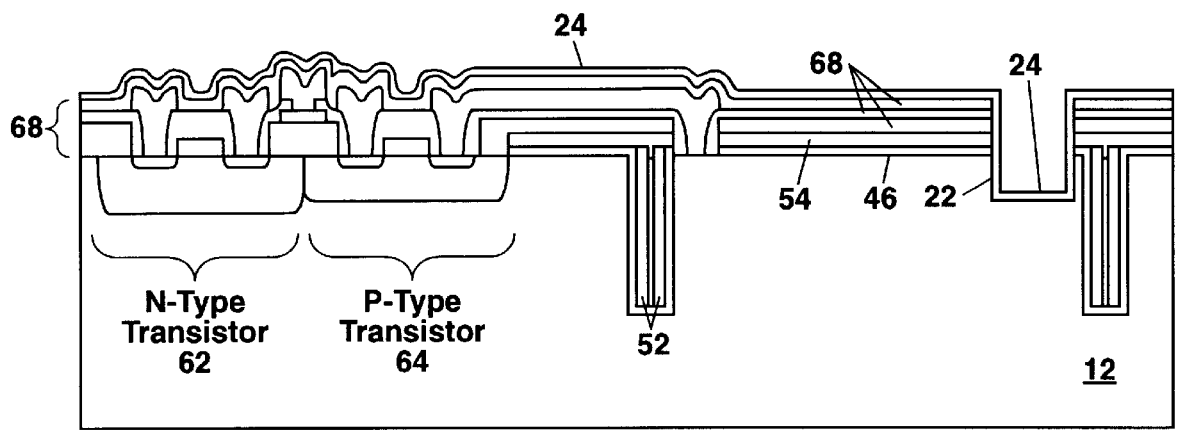
Figure 12O:
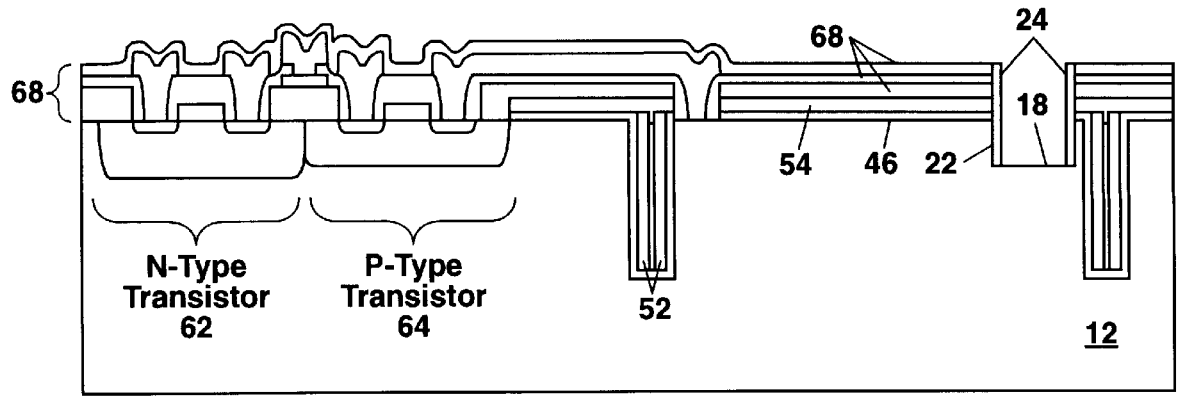

In FIG. 12n, a protection layer 24, as described previously with reference to FIGS. 3c and 9j is deposited over the exposed portion 18 and the sidewalls 22. The protection layer 24 can also be optionally deposited to blanket the back surface of the substrate 12. The protection layer 24 is then anisotropically dry etched back to remove all of the layer 24 on the top surface of the substrate 12 except for a vertically-disposed portion as shown in FIG. 12o which protects the sidewalls 22 from chemical attack during a later undercutting etch step.

Figure 12P:
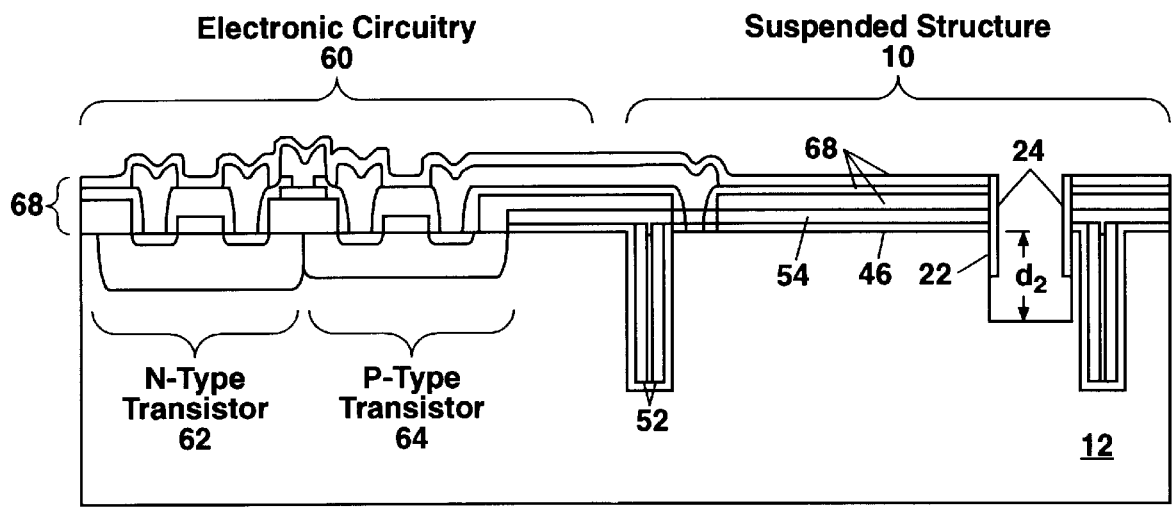
Figure 12Q:
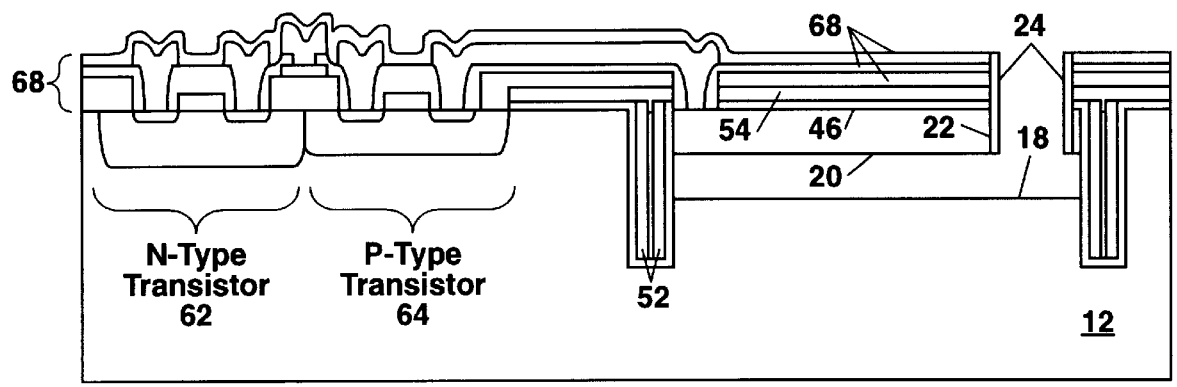
Figure 12R:
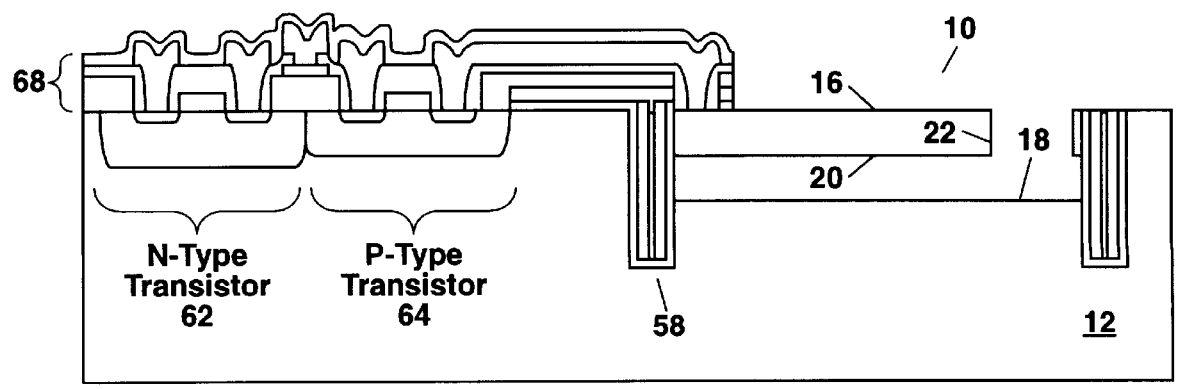

In FIG. 12p, the exposed portion 18 of the {111}-silicon substrate 12 is etched down to the second etch depth, $d_2$, as previously described with reference to FIGS. 3d and 9l, thereby forming one or more exposed vertical surfaces 26 of the substrate 12. Exposure of the integrated device 200 to an undercutting etchant (e.g. KOH) laterally etches away the silicon between the first and second etch depths, effectively stopping at the horizontal {111}-silicon planes that are substantially co-planar with the top surface of the substrate 12 and spaced therefrom by the first and second etch depths. The undercutting etchant also stops upon reaching each etch-stop. The undercutting etch step forms a lower surface 20 of the suspended structure 10. Details of the undercutting etch step have been previously described with reference to FIGS. 3e and 9m.

In FIG. 12r, the suspended micromechanical structure 10 is completed and released by removing the protection layer 24 and a portion of the layers 48, 54 and 68 directly overlying the upper surface 16 of the structure 10. These layers can be removed using one or more etching steps that can be based on selective wet etching and/or anisotropic dry etching. The etch-stop in contact with the suspended structure 10 forms an insulating support 58 so that the structure 10 can be electrically isolated from the substrate 12 (e.g. for electrostatic actuation of the structure 10, or for sensing an electrical capacitance between the structure 10 and the underlying substrate 12). The completed integrated device 200 can be packaged by means known to the art.

Other applications and variations of the method for forming suspended micromechanical structures of the present invention will become evident to those skilled in the art. For example, surface micromachining of one or more deposited polysilicon layers separated by sacrificial layers can be combined with the present invention to provide increased manufacturing flexibility. In this case, the surface micromachined layers can be formed above the upper surface 16 and protected by intervening and overlying sacrificial layers prior to the undercutting etch step. The surface micromachined layers and sacrificial layers can even be used to form a composite mask layer for use in etching downward into the substrate to the first and second etch depths. After the undercutting etch step, one or more elements formed in the surface micromachined polysilicon layers can be released (e.g. using a wet etchant comprising HF to remove the sacrificial layers which can comprise silicon dioxide or silicate glass). The actual scope of the invention is intended to be defined in the following claims when viewed in their proper perspective based on the prior art.

What is claimed is:

1. A micromachining method for forming a suspended micromechanical structure in a silicon substrate having a top surface oriented along a {111} crystal plane, comprising steps for:
    (a) dry etching portions of the substrate down to a first etch depth below the top surface of the substrate and thereby forming a plurality of sidewalls of the suspended micromechanical structure;
    (b) coating the sidewalls with a protection layer;
    (c) dry etching the substrate down beyond the first etch depth to a second etch depth; and
    (d) wet etching the substrate with a selective anisotropic wet etchant and laterally undercutting the substrate below the first etch depth to define a lower surface of the suspended micromechanical structure.

2. The method of claim 1 wherein the protection layer is resistant to attack by the selective anisotropic wet etchant.

3. The method of claim 2 wherein the selective anisotropic wet etchant is selected from the group consisting of potassium hydroxide, tetramethyl ammonium hydroxide (TMAH) and ethylenediamine pyrocatechol (EDP).

4. The method of claim 3 wherein the undercutting etch step is performed at a temperature in the range of 10–100° C.

5. The method of claim 4 further including a step for forming at least one etch-stop to limit a lateral extent of the undercutting etch step.

6. The method of claim 5 further including steps for forming electronic circuitry comprising a plurality of interconnected transistors on the substrate proximate to the suspended micromechanical structure.

7. The method of claim 6 wherein the steps for forming the electronic circuitry are performed prior to the undercutting etch step.

8. The method of claim 7 wherein the steps for forming the electronic circuitry further include a step for forming electrical interconnections to the suspended micromechanical structure.

9. A product formed by the method of claim 1.

10. A product formed by the method of claim 8.

11. A micromachining method for forming a suspended micromechanical structure in a {111} crystalline silicon substrate, comprising steps for:
    (a) masking a top surface of the substrate to define an outline of the suspended structure to be formed in the substrate;
    (b) etching the substrate outside the outline of the suspended structure down to a first etch depth and thereby forming a plurality of exposed sidewalls of the suspended structure;
    (c) forming a protection layer over the exposed sidewalls of the suspended structure;
    (d) etching the substrate outside the outline of the suspended structure down to a second etch depth which is greater than the first etch depth; and
    (e) laterally undercutting the substrate below the suspended structure between the first and second etch depths using a selective anisotropic wet etchant.

12. The method of claim 11 wherein the steps for etching the substrate down to the first and second etch depths comprises anisotropic dry etching.

13. The method of claim 12 wherein the anisotropic dry etching comprises reactive ion etching.

14. The method of claim 11 wherein the protection layer is selected from the group consisting of silicon dioxide, silicon nitride, silicate glass, metals and metal alloys.

15. The method of claim 14 wherein the step for forming the protection layer comprises depositing the protection layer by chemical vapor deposition.

16. The method of claim 14 wherein the step for forming the protection layer comprises depositing the protection layer by plasma-enhanced chemical vapor deposition.

17. The method of claim 11 wherein the step for forming the protection layer comprises forming a thermal oxide.

18. The method of claim 11 wherein the selective anisotropic wet etchant comprises an alkali hydroxide etchant.

19. The method of claim 18 wherein the alkali hydroxide etchant is selected from the group consisting of potassium hydroxide, sodium hydroxide and cesium hydroxide.

20. The method of claim 11 wherein the selective anisotropic wet etchant comprises tetramethyl ammonium hydroxide (TMAH).

21. The method of claim 11 wherein the selective anisotropic wet etchant comprises ethylenediamine pyrocatechol (EDP).

22. The method of claim 11 further including a step for forming at least one etch-stop for limiting a lateral extent of undercutting etch step.

23. The method of claim 11 further including steps for forming electronic circuitry on the substrate proximate to the suspended structure.

24. The method of claim 23 wherein the electronic circuitry comprises a plurality of interconnected transistors selected from the group consisting of bipolar transistors, complementary metal-oxide semiconductor (CMOS) transistors and bipolar complementary metal-oxide semiconductor (BiCMOS) transistors.

25. The method of claim 23 wherein the steps for forming the electronic circuitry are performed prior to the undercutting etch step.

26. A product formed by the method of claim 11.

27. A product formed by the method of claim 23.

28. A micromachining method for forming a suspended micromechanical structure from crystalline silicon with substantially planar and parallel upper and lower surfaces, comprising steps for:

(a) providing a silicon substrate having a top surface aligned substantially along a {111} crystal plane;

(b) forming a patterned mask layer over the top surface of the silicon substrate to define a substantially planar upper surface of the suspended structure being formed in the substrate;

(c) etching portions of the substrate not covered by the patterned mask layer down to a first etch depth, thereby forming a plurality of exposed sidewalls of the suspended structure being formed;

(d) forming a protection layer over the exposed sidewalls of the suspended structure being formed;

(e) etching the portions of the substrate not covered by the patterned mask layer down to a second etch depth greater than the first etch depth; and (f) laterally undercutting the substrate below the suspended structure being formed by removing substrate material at depths between the first and second etch depths using a selective anisotropic wet etchant that substantially terminates etching upon reaching a plurality of {111} crystal planes of the silicon substrate, thereby forming a substantially planar lower surface of the suspended structure, with the lower surface being substantially parallel to the upper surface.

29. The method of claim 28 wherein the step for forming the patterned mask layer comprises depositing and patterning a masking material selected from the group consisting of photoresist, silicon dioxide, silicate glass, silicon nitride, metals and metal alloys.

30. The method of claim 29 wherein the step for patterning the masking material comprises providing a patterned photoresist over the masking material and dry etching the masking material through openings in the patterned photoresist.

31. The method of claim 28 wherein the step for etching portions of the substrate down to the first etch depth comprises anisotropic dry etching.

32. The method of claim 31 wherein the step for etching the portions of the substrate down to the second etch depth comprises anisotropic dry etching.

33. The method of claim 32 wherein each anisotropic dry etching step comprises reactive ion etching.

34. The method of claim 28 wherein the sidewalls of the suspended structure are oriented at substantially 90 degrees to the surface of the substrate.

35. The method of claim 28 wherein the step for forming the protection layer comprises depositing the protection layer by chemical vapor deposition (CVD) or plasma-enhanced chemical vapor deposition (PECVD).

36. The method of claim 28 wherein the protection layer is selected from the group consisting of silicon dioxide, silicon nitride, silicate glass, metals and metal alloys.

37. The method of claim 28 wherein the step for forming the protection layer comprises forming a thermal oxide.

38. The method of claim 28 wherein the step for forming the protection layer comprises forming a silicon dioxide layer by chemical vapor deposition (CVD) or plasma-enhanced chemical vapor deposition (PECVD).

39. The method of claim 28 wherein the step for forming the protection layer comprises forming a silicate glass layer by chemical vapor deposition (CVD) or plasma-enhanced chemical vapor deposition (PECVD).

40. The method of claim 28 wherein the step for forming the protection layer comprises forming a nitride layer by chemical vapor deposition (CVD) or plasma-enhanced chemical vapor deposition (PECVD).

41. The method of claim 28 wherein the step for forming the protection layer comprises forming a metal layer by evaporation or sputtering.

42. The method of claim 41 wherein the metal layer comprises tungsten.

43. The method of claim 28 wherein the step for forming the protection layer comprises forming a metal alloy layer by evaporation or sputtering.

44. The method of claim 43 wherein the metal alloy layer comprises a titanium nitride (TiN) alloy or a titanium tungsten (TiW) alloy.

45. The method of claim 28 wherein the selective anisotropic wet etchant comprises potassium hydroxide (KOH).

46. The method of claim 28 wherein the selective anisotropic wet etchant comprises tetramethyl ammonium hydroxide (TMAH).

47. The method of claim 28 wherein the selective anisotropic wet etchant comprises ethylenediamine pyrocatechol (EDP).

48. The method of claim 28 wherein the selective anisotropic wet etchant comprises sodium hydroxide (NaOH).

49. The method of claim 28 wherein the selective anisotropic wet etchant comprises cesium hydroxide (CsOH).

50. The method of claim 28 wherein the undercutting etch step is performed at a temperature within the range of 10–100° C.

51. The method of claim 28 further comprising a step for removing the patterned mask layer and protection layer after the undercutting etch step.

52. The method of claim 28 wherein the undercutting etch step forms a pedestal connecting the suspended structure to the substrate.

53. The method of claim 52 wherein the pedestal is formed at one edge of the suspended structure.

54. The method of claim 52 wherein the pedestal is formed near the center of the suspended structure.

55. The method of claim 28 wherein undercutting etch step forms the suspended structure as a cantilevered plate or beam.

56. The method of claim 28 further comprising steps for etching a shaped opening into the substrate to a third etch depth greater than the second etch depth and forming an etch-stop in the opening to terminate the undercutting etch step upon reaching the etch-stop.

57. The method of claim 56 wherein the etch-stop is formed from at least one material selected from the group consisting of polysilicon, silicon dioxide, silicon nitride and silicate glass.

58. The method of claim 57 wherein the etch-stop electrically insulates the suspended structure from the substrate.

59. The method of claim 56 wherein the shaped opening is located within an outline of the suspended structure.

60. The method of claim 56 wherein the shaped opening is located adjacent to an outline of the suspended structure.

61. The method of claim 28 further comprising steps for forming electronic circuitry on the substrate proximate to the suspended structure.

62. The method of claim 61 wherein the electronic circuitry comprises bipolar circuitry.

63. The method of claim 61 wherein the electronic circuitry comprises complementary metal-oxide semiconductor (CMOS) circuitry.

64. The method of claim 61 wherein the electronic circuitry comprises bipolar complementary metal-oxide semiconductor (BiCMOS) circuitry.

65. The method of claim 61 wherein the steps for forming the electronic circuitry are performed prior to the undercutting etch step.

66. The method of claim 61 wherein the steps for forming the electronic circuitry further include a step for forming electrical interconnections to the suspended micromechanical structure.

67. The method of claim 61 wherein the steps for forming the electronic circuitry further include a step for forming a passivation layer over the electronic circuitry to protect the electronic circuitry from exposure to the anisotropic wet etchant.

68. A product formed by the method of claim 28.

69. A product formed according to the method of claim 61.

* * * * *